(12) United States Patent
Takada et al.

(10) Patent No.: US 10,373,656 B2
(45) Date of Patent: Aug. 6, 2019

(54) MEMORY SYSTEM THAT CARRIES OUT TEMPERATURE-BASED ACCESS TO A MEMORY CHIP

(71) Applicant: Toshiba Memory Corporation, Tokyo (JP)

(72) Inventors: Marie Takada, Yokohama Kanagawa (JP); Masanobu Shirakawa, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,601

(22) Filed: Sep. 1, 2017

(65) Prior Publication Data

US 2018/0090218 A1    Mar. 29, 2018

(30) Foreign Application Priority Data

Sep. 26, 2016   (JP) ................................. 2016-187376
Mar. 29, 2017   (JP) ................................. 2017-065622

(51) Int. Cl.
*G11C 7/04*   (2006.01)
*G11C 16/34*  (2006.01)
(Continued)

(52) U.S. Cl.
CPC .............. *G11C 7/04* (2013.01); *G06F 3/0619* (2013.01); *G06F 3/0659* (2013.01); *G06F 3/0679* (2013.01); *G06F 11/1048* (2013.01); *G06F 11/1068* (2013.01); *G11C 16/0483* (2013.01); *G11C 16/08* (2013.01); *G11C 16/10* (2013.01); *G11C 16/26* (2013.01); *G11C 16/30* (2013.01); *G11C 16/3431* (2013.01);
(Continued)

(58) Field of Classification Search
CPC ....... G11C 7/04; G06F 1/206; G06F 11/1608; H05K 1/0212
See application file for complete search history.

(56) References Cited

U.S. PATENT DOCUMENTS 6,873,509 B2 *  3/2005  Partsch ................... G11C 7/04
                                              361/103
8,116,160 B2 *  2/2012  Hwang ............... G06F 11/1068
                                              365/185.22
(Continued)

FOREIGN PATENT DOCUMENTS

JP    2012194897 A    10/2012
JP    2012212486 A    11/2012

*Primary Examiner* — Vanthu T Nguyen
(74) *Attorney, Agent, or Firm* — Kim & Stewart LLP

(57) ABSTRACT

A memory system is connectable to a host and comprises a memory chip including a nonvolatile semiconductor memory cell array, a memory controller, a first temperature sensor positioned to measure a first temperature, which is representative of a temperature of the memory controller, and a second temperature sensor positioned to measure a second temperature, which is representative of a temperature of the memory chip. The memory controller is configured to compare the first temperature against a first threshold temperature and a second temperature against a second threshold temperature and carry out access to the memory chip when either the first temperature is greater than the first threshold temperature or the second temperature is greater than the second threshold temperature.

14 Claims, 23 Drawing Sheets

(51) Int. Cl.
*G06F 3/06* (2006.01)
*G11C 16/08* (2006.01)
*G11C 16/04* (2006.01)
*G11C 16/30* (2006.01)
*G06F 11/10* (2006.01)
*G11C 29/52* (2006.01)
*G11C 16/10* (2006.01)
*G11C 16/26* (2006.01)
*H01L 27/115* (2017.01)
*H01L 27/11582* (2017.01)

(52) U.S. Cl.
CPC ............ *G11C 29/52* (2013.01); *H01L 27/115* (2013.01); *H01L 27/11582* (2013.01)

(56) References Cited

U.S. PATENT DOCUMENTS

| | | | |
|---|---|---|---|
| 8,472,274 B2* | 6/2013 | Fai | G11C 11/5642 365/185.09 |
| 9,668,337 B2* | 5/2017 | Stoev | H05K 1/0212 |
| 9,678,490 B2* | 6/2017 | Berke | G05B 15/02 |
| 9,837,146 B2* | 12/2017 | Yang | G11C 11/5642 |
| 2012/0287711 A1 | 11/2012 | Kim et al. | |
| 2017/0255403 A1* | 9/2017 | Sharon | G06F 3/0619 |
| 2018/0073933 A1* | 3/2018 | Keskin | G01K 1/026 |

* cited by examiner

US 10,373,656 B2

MEMORY SYSTEM THAT CARRIES OUT TEMPERATURE-BASED ACCESS TO A MEMORY CHIP

CROSS-REFERENCE TO RELATED APPLICATIONS

This application is based upon and claims the benefit of priority from Japanese Patent Application No. 2016-187376, filed Sep. 26, 2016 and Japanese Patent Application No. 2017-065622, filed Mar. 29, 2017, the entire contents of each of which are incorporated herein by reference.

FIELD

Embodiments described herein relate to a memory system.

BACKGROUND

A memory system of one type includes a nonvolatile memory such as a NAND-type flash memory, and a memory controller.

DETAILED DESCRIPTION

An embodiment provides a memory system that can reduce read errors.

According to an embodiment, a memory system is connectable to a host and comprises a memory chip including a nonvolatile semiconductor memory cell array, a memory controller, a first temperature sensor positioned to measure a first temperature, which is representative of a temperature of the memory controller, and a second temperature sensor positioned to measure a second temperature, which is representative of a temperature of the memory chip. The memory controller is configured to compare the first temperature against a first threshold temperature and a second temperature against a second threshold temperature and carry out access to the memory chip when either the first temperature is greater than the first threshold temperature or the second temperature is greater than the second threshold temperature.

Hereinafter, embodiments will be described with reference to the drawings.

First Embodiment

Figure 1:
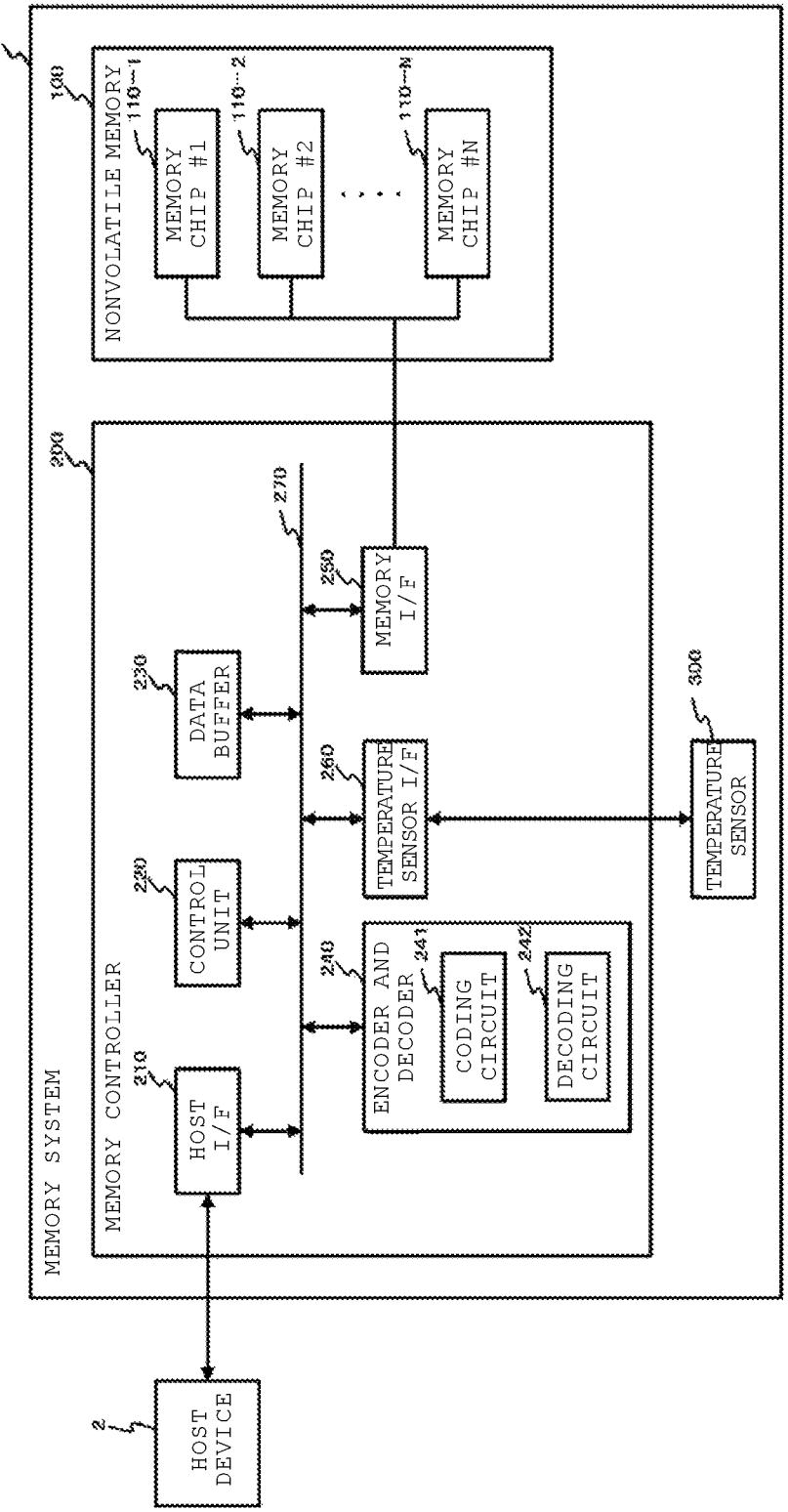
FIG. 1 is a block diagram of a memory system according to a first embodiment.

FIG. 1 is a block diagram of a memory system according to a first embodiment. A memory system 1 is connected to a host device 2 via a communication line, and functions as an external storage device of the host device 2. The host device 2 may be, for example, an information processing device such as a personal computer, a mobile phone, and an image capturing device. The host device 2 may be a mobile phone such as a tablet computer or a smart phone, or a game device. The host device 2 may be an in-vehicle terminal such as a car navigation system.

A nonvolatile memory 100 is a memory which stores data with a non-volatile manner. The nonvolatile memory 100 is, for example, a non-volatile semiconductor memory which includes a plurality of memory chips, that is, a memory chip#1 110-1, . . . , and a memory chip#N 110-N. N is a certain natural number.

In the following descriptions, if each of the plurality of memory chips 110-1, . . . , and 110-N needs to be specified, the reference numerals of 110-1, . . . , and 110-N are used. However, when the memory chips do not need to be specified, the reference numeral of 110 is used.

Each of the memory chips 110 may, for example, independently operate. An example of each of the memory chips 110 may be a NAND-type flash memory chip. In the NAND-type flash memory, generally, writing and reading is performed in a data unit which is referred to as a page, and erasing (invalidation) is performed in a data unit which is referred to as a block.

Hereinafter, the NAND-type flash memory will be described as an example of the nonvolatile memory 100. However, a storage unit such as a three-dimensional-structure flash memory, a resistance random access memory (ReRAM), and a ferroelectric random access memory (FeRAM), which is a memory other than the NAND-type flash memory may be used as the nonvolatile memory 100. Here, an example using a semiconductor memory as a storage unit will be described. However, a storage unit other than the semiconductor memory may be used.

The memory system 1 may be a memory card in which a memory controller 200 and the nonvolatile memory 100 are configured as one package, or may be a solid state drive (SSD).

The memory controller 200 controls writing into the nonvolatile memory 100, in accordance with a write request from the host device 2. In the present embodiment, the request may be a command, for example. The memory controller 200 controls reading from the nonvolatile memory 100, in accordance with a read request from the host device 2. The memory controller 200 may be also referred to as a controller.

The memory controller 200 includes a host interface (host I/F) 210, a control unit 220, a data buffer 230, an encoder and decoder 240, a memory interface (memory I/F) 250, and a temperature-sensor interface (temperature sensor I/F) 260. The host I/F 210, the control unit 220, the data buffer 230, the encoder and decoder 240, the memory I/F 250, and the temperature sensor I/F 260 are connected to each other through an internal bus 270.

The host I/F 210 performs processing according to the interface standards with the host device 2, and outputs a request from the host device 2, user data, and the like to the internal bus 270. The host I/F 210 transmits user data read from the nonvolatile memory 100, a response, and the like from the control unit 220, to the host device 2. In the present embodiment, data written into the nonvolatile memory 100 in accordance with the write request from the host device 2 is referred to as user data.

The control unit 220 controls components of the memory system 1. The control unit 220 may be achieved by hardware, or may be achieved in such a manner that a processor such as a central processing unit (CPU) executes firmware. In the latter case, when the memory system 1 receives supply of power, the processor reads firmware (control program) stored in a ROM (not illustrated) and loads to the buffer 230 or a RAM (not illustrated) in the control unit 220. The processor performs predetermined processing so as to function as the control unit 220. Here, the processor may be also referred to as a core or a core processor.

When a request is received from the host device 2 via the host I/F 210, the control unit 220 performs control according to a command in the request. For example, the control unit 220 instructs the memory I/F 250 to write user data and parity into the nonvolatile memory 100, in accordance with a request from the host device 2. The control unit 220 sends, to the memory I/F 250, a command for the nonvolatile memory 100, in accordance with a request from the host device 2.

When a write request is received from the host device 2, the control unit 220 determines a storage area (memory area) on the nonvolatile memory 100, for user data stored in the data buffer 230. That is, the control unit 220 determines a writing destination of the user data. Correspondence between a logical address of the user data received from the host device 2, and a physical address indicating a storage area (in which the user data is stored) on the nonvolatile memory 100 is stored as an address conversion table.

When a read request is received from the host device 2, the control unit 220 converts a logical address designated by the read request, into a physical address by referring to the above-described address conversion table. Then, the control unit 220 instructs the memory I/F 250 to perform reading from the physical address.

The data buffer 230 temporarily stores user data that the memory controller 200 received from the host device 2, until the user data are stored in the nonvolatile memory 100. Also, the data buffer 230 temporarily stores user data read from the nonvolatile memory 100, until the user data are transmitted to the host device 2. The data buffer 230 includes, for example, a general-purpose memory such as a static random access memory (SRAM) or a dynamic random access memory (DRAM). The data buffer 230 may be mounted in the memory controller 200 or may be mounted on the outside of the memory controller 200, so as to be separate from the memory controller 200.

The encoder and decoder 240 includes an encoding circuit 241 and a decoding circuit 242. The encoder and decoder 240 may be also referred to as an error correcting code (ECC) circuit. The encoding circuit 241 codes data held in the data buffer 230 so as to generate a code word which includes data and parity. The encoding circuit 241 codes (error-correction codes) user data having a first data length, so as to generate a code word having a second data length. The encoding circuit 241 may perform encoding, for example, using the Bose-Chaudhuri-Hocquenghem (BCH) code, the Reed-Solomon (RS) code, a low density parity check (LDPC) code, and the like. The error correction code used by the encoding circuit 241 is not limited thereto. The decoding circuit 242 acquires a code word, which is data read from the nonvolatile memory 100 via the memory I/F 250, and decodes the acquired code word. When error correction fails in decoding, the decoding circuit 242 notifies the control unit 220 of failure in the error correction.

The memory I/F 250 controls the nonvolatile memory 110. The memory I/F 250 writes a code word output from the encoding circuit 241, in the nonvolatile memory 110 in accordance with control of the control unit 220 and the like. The memory I/F 250 reads data from the nonvolatile memory 110, and transfers the read data to the decoding circuit 242 via the buffer 230, in accordance with control of the control unit 220 and the like. Further, the memory I/F 250 erases data held in the nonvolatile memory 110, in accordance with control of the control unit 220 and the like.

The memory I/F 250 and each of the memory chips 110 are connected to each other by a bus according to the NAND interface. A signal transmitted or received through this bus includes, for example, a chip enable signal /CE, an address latch enable signal ALE, a command latch enable signal CLE, a write enable signal /WE, a read enable signal /RE, and an input and output signal I/O. The signal /CE is a signal for causing the memory chip 110 to be in an enable state. The signal ALE is a signal for notifying the memory chip 110 that an input signal indicates an address. The signal CLE is a signal for notifying the memory chip 110 that an input signal indicates a command. The signal /WE is a signal for taking an input signal into the memory chip 110. The signal /RE is a signal for taking an output signal into the memory I/F 250. The input and output signal I/O is a signal indicating a command, an address, data, and the like.

The temperature sensor 300 is a sensor for measuring the temperature of the memory controller 200, and is arranged in the vicinity of the memory controller 200. "The temperature of the memory controller 200" in the following descriptions means a temperature measured by the temperature sensor 300, and includes temperature information obtained through measuring by the temperature sensor 300. The temperature sensor I/F 260 has a function of a communication interface between the memory controller 200 and the temperature sensor 300. The control unit 220 acquires temperature information obtained through measuring by the temperature sensor 300, through the temperature sensor I/F 260.

The temperature sensor 300 may spontaneously output the temperature information to the control unit 220 via the temperature sensor I/F 260. In addition, the temperature sensor I/F 260 may transmit measurement information acquired from the temperature sensor 300 to the control unit 220 in accordance with a request from the control unit 220. In the latter case, a command for acquiring temperature information is transmitted to the temperature sensor I/F 260 from the control unit 220. The temperature sensor I/F 260 transmits temperature information acquired from the temperature sensor 300 to the control unit 220 as a response to the command.

The memory system 1 may include a plurality of temperature sensors 300 mounted therein. Temperature sensor I/Fs 260 may be respectively provided for the plurality of temperature sensors 300, and the control unit 220 may acquire temperature information from each of the temperature sensor I/Fs 260. In addition, one temperature sensor I/F 260 may be provided for the plurality of temperature sensors 300, and the control unit 220 may acquire temperature information obtained through measuring by each of the plurality of temperature sensors 300, through the temperature sensor I/F 260. The control unit 220 determines the temperature of the memory controller 200 based on temperature information received from the temperature sensor I/F 260, which is obtained through measuring by each of the plurality of temperature sensors 300. As a method of determining the temperature of the memory controller 200, there are the following methods: a method of using an average value of temperatures obtained from the plurality of temperature sensors 300; a method of using a median value of the temperature information; and a method of selectively using temperature information obtained from a specific temperature sensor 300.

The temperature sensor 300 may be mounted in the memory controller 200. Also, the temperature sensor 300 may be mounted in the memory controller 200, and the temperature sensor 300 and the control unit 220 may be connected to each other via the bus 270. Thus, the temperature sensor 300 may transmit temperature information to the control unit 220 according to a request from the control unit 220. A plurality of temperature sensors 300 may be mounted in the memory controller 200. When the plurality of temperature sensors 300 is mounted in the memory controller 200, the control unit 220 determines the temperature of the memory controller 200, based on temperature information obtained from the plurality of temperature sensors 300.

Figure 2:
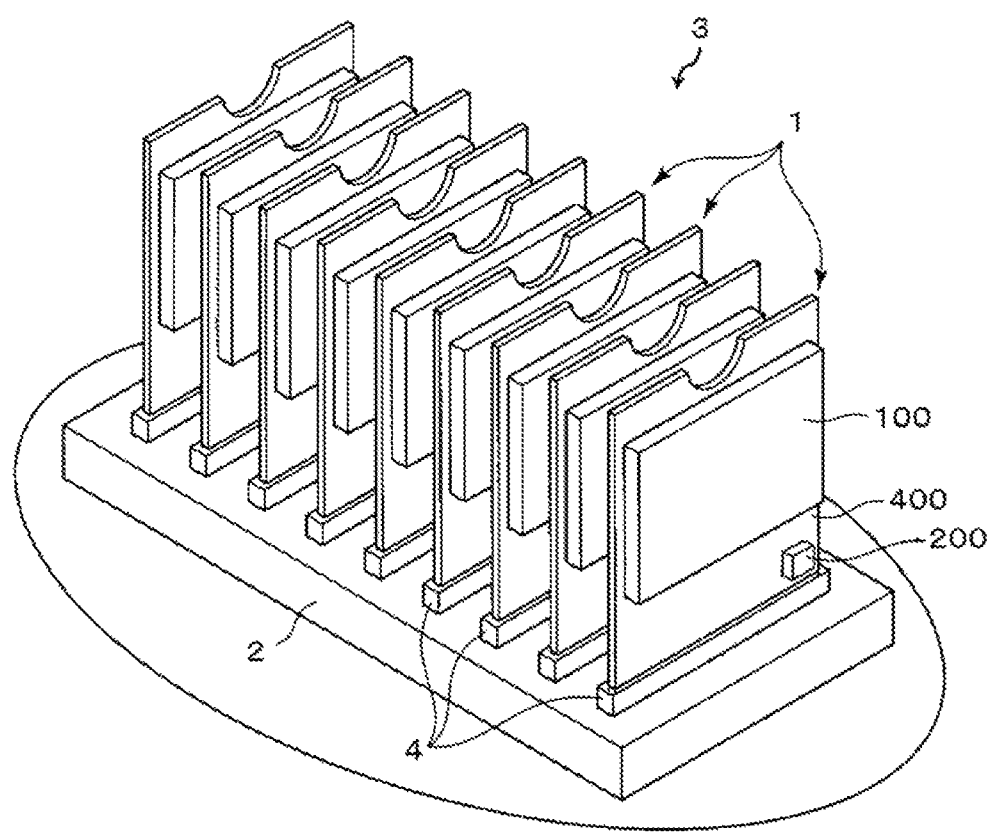
FIG. 2 illustrates an example of a system including the memory system according to the first embodiment.
Figure 3:
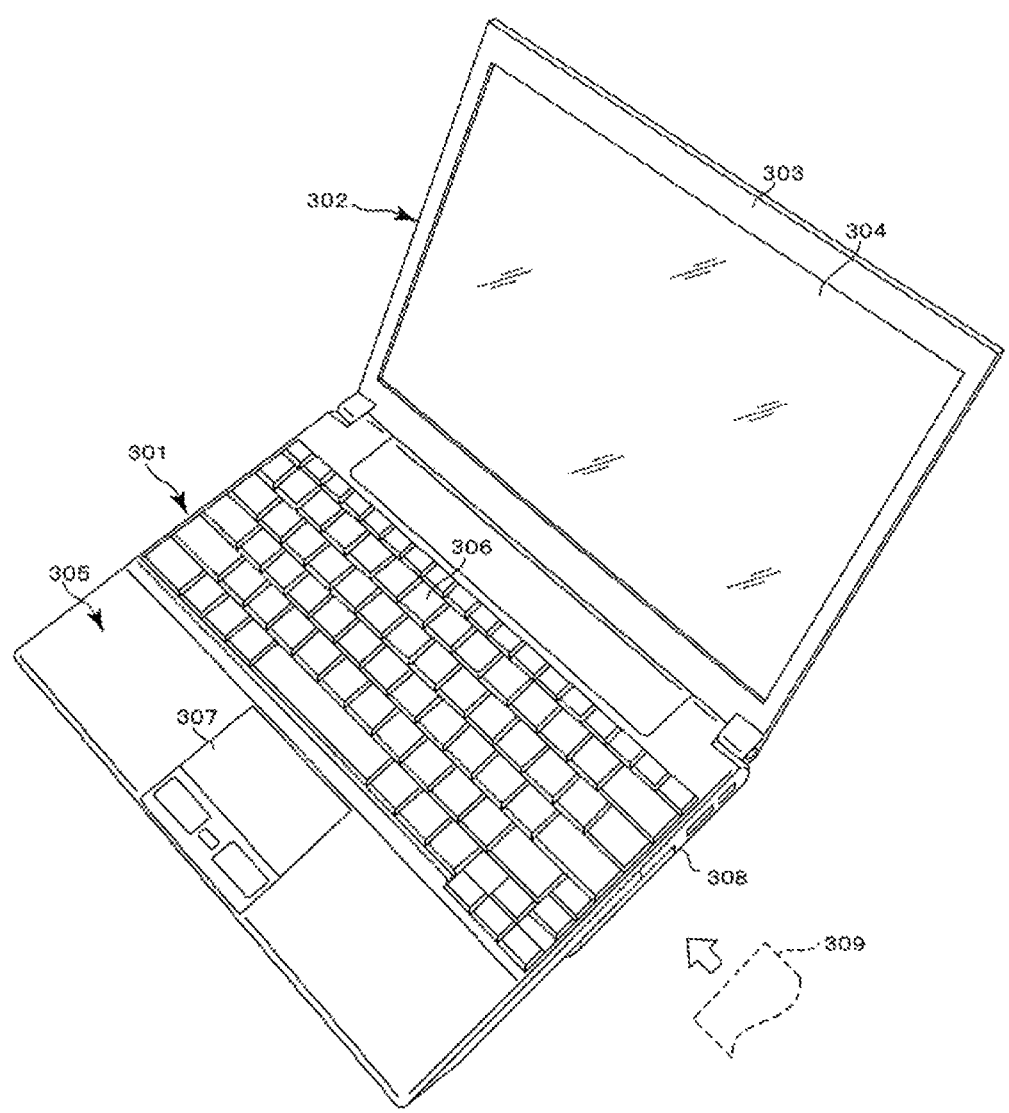
FIG. 3 illustrates an example of a portable computer including the memory system according to the first embodiment.

FIGS. 2 and 3 illustrate an example of a system 3 including the memory system 1 and the host device 2. The system 3 is an example of electronic equipment.

As illustrated in FIG. 2, the memory system 1 serves as a storage device in the system 3 such as a server. The system 3 includes the memory system 1 and the host device 2 to which the memory system 1 is connected. The host device 2 includes a plurality of connectors 4 which are open upwardly, for example. The connector 4 is, for example, a slot. In FIG. 2, the memory system 1 includes a board 400. The nonvolatile memory 100 and the memory controller 200 are mounted on the board 400. A plurality of memory systems 1 is connected to the connectors 4 of the host device 2. The memory systems 1 are supported to be parallel to each other with an orientation of standing up in a substantially vertical direction. With such a configuration, the plurality of memory systems 1 can be integrally mounted in a compact size, and it is possible to reduce the size of the host device 2.

The memory system 1 may be used as, for example, a storage device of an electronic device, such as a notebook type portable computer, a tablet terminal, and a detachable note type personal computer (PC). As illustrated in FIG. 3, the memory system 1 is mounted in, for example, a portable computer corresponding to the host device 2. Here, the entirety of the portable computer including the memory system 1 is defined as the system 3.

The portable computer includes a main body 301 and a display unit 302. The display unit 302 includes a display housing 303 and a display device 304 which is accommodated in the display housing 303.

The main body 301 includes a casing 305, a keyboard 306, and a touchpad 307 which is a pointing device. The casing 305 includes a main circuit board, an optical disk device (ODD) unit, a card slot 308, and the like.

The card slot 308 is provided on a side surface of the casing 305. A user may insert an additional device 309 into the card slot 308 from the outside of the casing 305.

The memory system 1 may be used as a substituent of a hard disk drive (HDD), in a state of being mounted in the portable computer. In addition, the memory system 1 may be used as the additional device 309.

Figure 4:
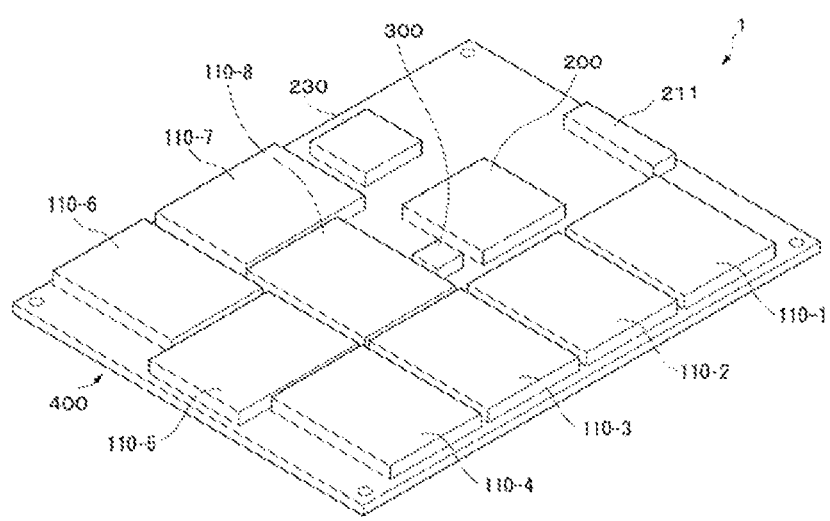
FIG. 4 is a perspective view of the memory system according to the first embodiment.

FIG. 4 is a perspective view of the memory system according to the first embodiment. In FIG. 4, the memory system 1 includes the board 400. Memory chips 110-1, 110-2, 110-3, 110-4, 110-5, 110-6, 110-7, and 110-8, a connection portion 211 included in the host I/F 210, the memory controller 200, a DRAM as the buffer 230, and the temperature sensor 300 are mounted on the board 400. However, the components on the board 400 are not limited thereto.

The host I/F 210 includes the connector (terminal portion) 211. In the memory system 1 illustrated in FIG. 4, the connector 211 is mounted on the outside of the memory controller 200, so as to be independent from the memory controller 200. The connector 211 includes, for example, a plurality of connection terminals (metal terminals). The connector 211 is put into, for example, the connector 4 of the host device 2, so as to be electrically connected to the connector 4. The host I/F 210 performs communication of a signal with the host device 2 through the connector 211.

In the memory system 1 illustrated in FIG. 4, each of the memory chips 110 is disposed so that side surfaces thereof face side surfaces of other memory chips 110, the memory controller 200, the DRAM as the buffer 230, or the temperature sensor 300, with a gap of a predetermined length. The temperature sensor 300 is disposed at a position surrounded by the memory controller 200, the NAND memories 110-1, . . . , 110-8, and the DRAM as the buffer 230. However, the arrangement of the NAND memories 110-1, 110-2, 110-3, 110-4, 110-5, 110-6, 110-7, and 110-8, the host interface 210, the memory controller 200, the DRAM as the buffer 230, and the temperature sensor 300 is an example, and is not limited thereto.

Figure 5:
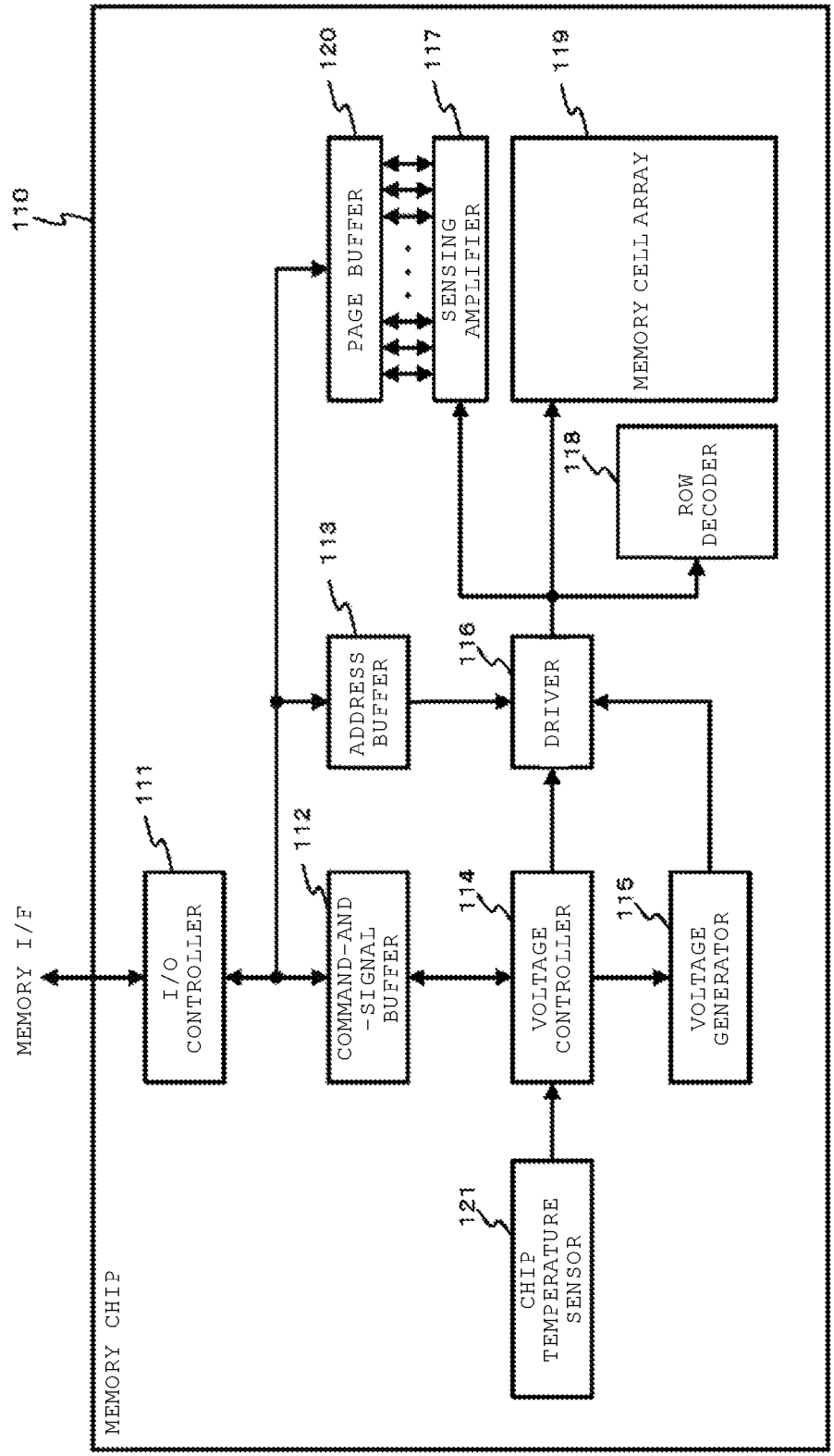
FIG. 5 is a block diagram of a memory chip in the memory system according to the first embodiment.

Next, a configuration of the memory chip 110 will be described. FIG. 5 is a block diagram of the memory chip 110 according to the present embodiment. As described above, the memory chip 110 is, for example, a NAND-type flash memory chip. In the present embodiment, the memory chip 110 is a three-dimensional stack type NAND-type flash memory in which memory cells are three-dimensionally stacked over a semiconductor board.

The memory chip 110 includes an input and output (I/O) controller 111, a command-and-signal buffer 112, an address buffer 113, a voltage controller 114, a voltage generator 115, a driver 116, a sensing amplifier 117, a row decoder 118, a memory cell array 119, a page buffer 120, and a chip temperature sensor 121.

The memory cell array 119 includes a plurality of blocks BLK (BLK0, BLK1, BLK2, . . . ). Each of the blocks BLK is a set of a plurality of nonvolatile memory cells, and each of the nonvolatile memory cells is connected to a word line and a bit line. The block BLK is defined as an erasure unit of data. Data in the same block BLK are erased at the same time. Each of the blocks BLK includes a plurality of string units SU (SU0, SU1, SU2, . . . ) which is a set of NAND strings 131 in which memory cells are connected to each other in series. The number of blocks in the memory cell array 119 or the number of string units in one block BLK may be arbitrarily determined.

The I/O controller 111 outputs a command from the memory I/F 250 to the command-and-signal buffer 112, and outputs an address to the address buffer 113, based on an input signal. The I/O controller 111 sends data to the page buffer 120 when the I/O controller 111 receives a write command for the memory chip 110. The I/O controller 111 receives data from the page buffer 120 when the I/O controller 111 receives a read command for the memory chip 110.

The command-and-signal buffer 112 decodes the command output from the I/O controller 111, and outputs an instruction for performing an operation (for example, reading, writing, erasing, and the like) indicated by the command, to the voltage controller 114. The address buffer 113 decodes the address output from the I/O controller 111, and outputs the decoded address to the driver 116.

The voltage controller 114 controls an access operation to the memory cell array 119, in accordance with a command, which is output from the command-and-signal buffer 112.

The voltage generator 115 generates a program voltage CGPV for, for example, performing a writing operation, based on a control signal CGPVDAC from the voltage controller 114. The voltage generator 115 generates a reading voltage CGRV for, for example, performing a reading operation, based on a control signal CGRVDAC from the voltage controller 114.

The chip temperature sensor 121 measures the temperature of the memory chip 110, and outputs information of the measured temperature to the voltage controller 114, as memory-chip temperature information. The chip temperature sensor 121 may be mounted in the memory chip 110 or may be disposed in the vicinity of the memory chip 110.

The voltage controller 114 outputs the memory-chip temperature information output from the chip temperature sensor 121, to the memory controller 200 through the command-and-signal buffer 112 and the I/O controller 111. The voltage controller 114 may acquire the memory-chip temperature information output from the chip temperature sensor 121, and may correct the control signal CGPVDAC for generating the program voltage, using the acquired memory-chip temperature information.

The driver 116 controls operations of the sensing amplifier 117, the row decoder 118, and the memory cell array 119 based on the address from the address buffer 113 and an instruction from the voltage controller 114.

The row decoder 118 decodes a block address or a page address, and selects a word line of the corresponding block BLK. The row decoder 118 applies appropriate voltages to the selected word line, unselected word lines, and the like.

The sensing amplifier 117 senses data read from a memory cell into a bit line, when the data are read. When data are written, the sensing amplifier 117 transfers data to be written, to a memory cell.

Figure 6:
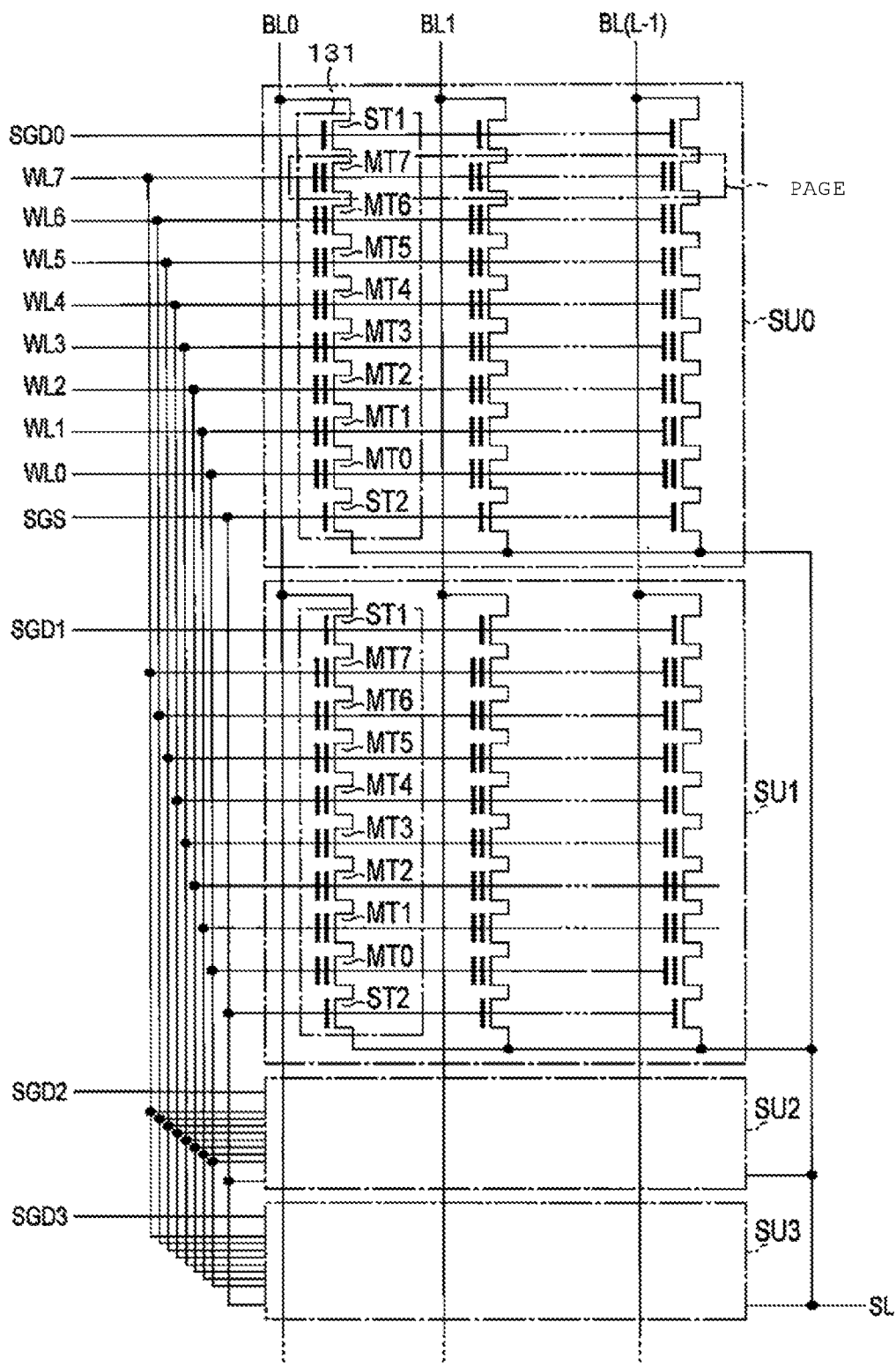
FIG. 6 is a circuit diagram of a memory cell array of the memory system according to the first embodiment.

Next, a configuration of a block BLK included in the memory cell array 119 will be described with reference to FIG. 6. FIG. 6 is a circuit diagram of the block BLK.

As illustrated in FIG. 6, the block BLK includes four string units SU (SU0 to SU3), for example. Each of the string units SU includes a plurality of NAND strings 131.

Each of the NAND strings 131 includes, for example, eight memory cell transistors MT (MT0 to MT7) and selection transistors ST1 and ST2. Each of the memory cell transistors MT includes a stacked gate which includes a control gate and a charge accumulated layer, and holds data with non-volatility. The number of memory cell transistors MT is not limited to eight, and may be 16, 32, 64, 128, and the like. The number of memory cell transistors MT may be randomly determined. The memory cell transistors MT are disposed between the selection transistors ST1 and ST2 so as to cause current paths of the memory cell transistors MT to be connected to each other in series. A current path of the memory cell transistor MT7 on one end side of this series connection is connected to one end of a current path of the selection transistor ST1. A current path of the memory cell transistor MT0 on another end of this series connection is connected to one end of a current path of the selection transistor ST2.

A gate of the selection transistor ST1 in each of the string units SU0 to SU3 is commonly connected to select gate lines SGD0 to SGD3. In addition, a gate of the selection transistor ST2 is commonly connected to select gate lines SGS between a plurality of string units. Each of control gates of the memory cell transistors MT0 to MT7 in the same block BLK0 is commonly connected to word lines WL0 to WL7.

That is, the word lines WL0 to WL7 and the select gate line SGS are commonly connected between the plurality of string units SU0 to SU3 in the same block BLK. To the contrary, the select gate lines SGD are independently connected to the string units SU0 to SU3, respectively, even in the same block BLK.

The other ends of the current paths of the selection transistors ST1 in NAND strings 131 which are in the same row among NAND strings 131 which are disposed in the memory cell array 119 in a matrix configuration are commonly connected to any bit line BL (BL0 to BL(L−1), (L−1) is a natural number of 1 or more.) That is, the bit line BL commonly connects NAND strings 131 between a plurality of blocks BLK. The other ends of the current paths of the selection transistors ST2 are commonly connected to a source line SL. The source line SL commonly connects, for example, NAND strings 131 between a plurality of blocks BLK.

As described above, pieces of data of the memory cell transistor MT in the same block BLK are erased at the same time. To the contrary, reading and writing of data is performed at the same time, for a plurality of memory cell transistors MT which are commonly connected to a certain word line WL in a certain string unit SU of a certain block BLK. When the memory cell is a single-level cell (SLC), a unit in which the above operations are performed at the same time corresponds to one page.

Figure 7:
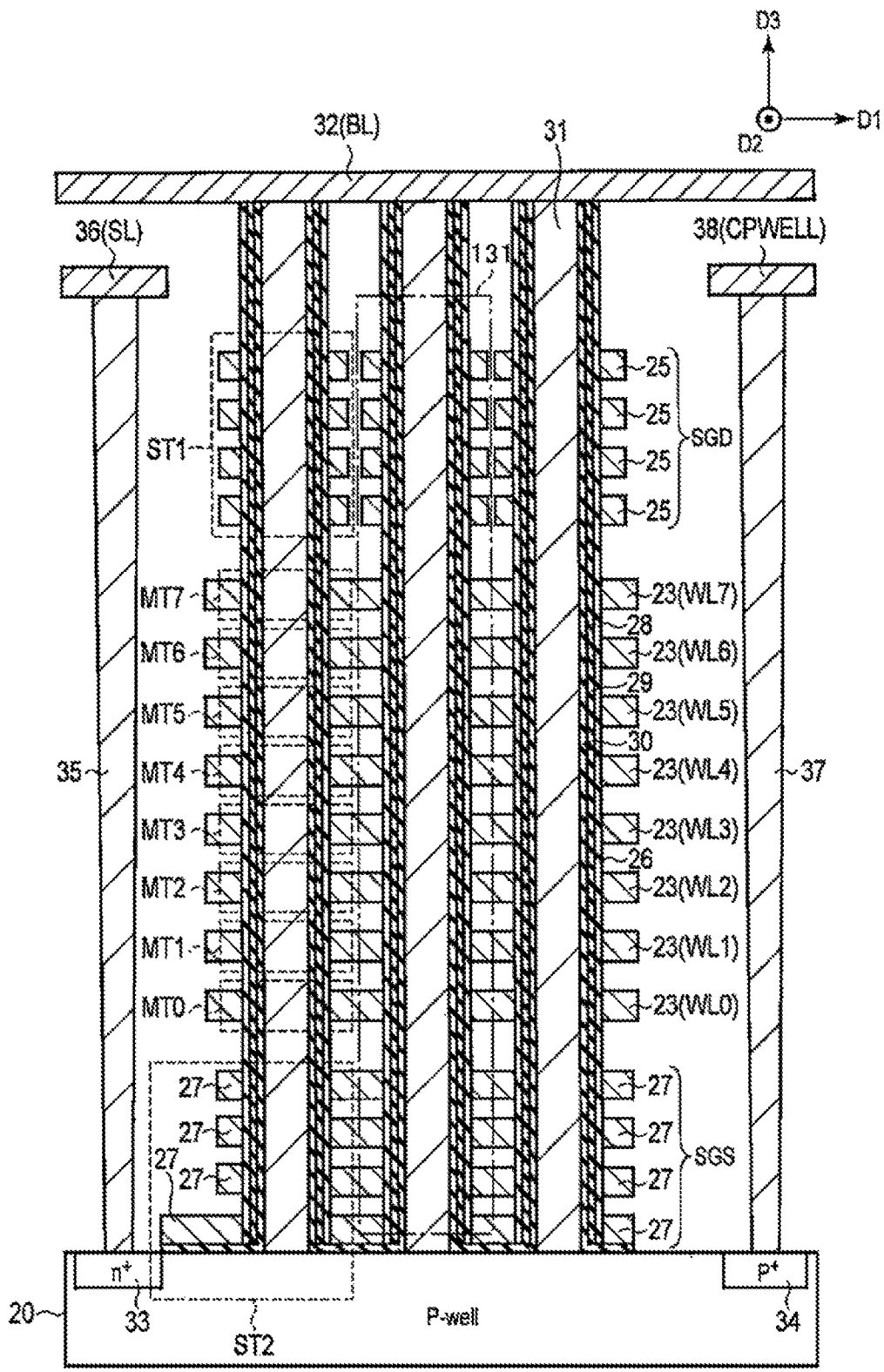
FIG. 7 is a cross-sectional view of the memory cell array of the memory system according to the first embodiment.

FIG. 7 is a cross-sectional view of a region of the memory cell array 119 according to the present embodiment. As illustrated in FIG. 7, a plurality of NAND strings 131 is formed on a P-type well region 20. That is, a plurality of wiring layers 27 which functions as the select gate lines SGS, a plurality of wiring layers 23 which functions as the word lines WL, and a plurality of wiring layers 25 which functions as the select gate lines SGD are formed on the well region 20.

A memory hole 26 is formed so as to penetrate the wiring layers 25, 23, and 27, and to reach the well region 20. A block insulating film 28, a charge accumulated layer (insulating film) 29, and a gate insulating film 30 are subsequently formed on a side surface of the memory hole 26. Further, a conductive film 31 is buried in the memory hole 26. The conductive film 31 functions as a current path of the NAND string 131, and is a region in which a channel is formed when the selection transistors ST1 and ST2 and the memory cell transistors MT are operated.

In each of the NAND strings 131, the wiring layers 27 of which the plurality (in this example, four layers) are provided are electrically commonly connected, and are connected to the same select gate line SGS. That is, the wiring layers 27 of four layers function as a gate electrode of substantially one selection transistor ST2. Such connection is similarly applied to the selection transistor ST1 (select gate line SGD of four layers).

With the above-described configuration, in each of the NAND strings 131, the selection transistor ST2, a plurality of memory cell transistors MT, and the selection transistor ST1 are subsequently stacked on the well region 20.

In FIG. 7, each of the selection transistors ST1 and ST2 includes a charge accumulated layer 29, similarly to the memory cell transistor MT. However, the selection transistors ST1 and ST2 do not function as memory cells in which data is held, but function as switches. At this time, threshold values which cause the selection transistors ST1 and ST2 to turn ON and OFF may be controlled by injecting charges to the charge accumulated layer 29.

A wiring layer 32 which functions as the bit line BL is formed at an upper end of the conductive film 31. The bit line BL is connected to the sensing amplifier 117.

An n+ type impurity diffusion layer 33 and a p+ type impurity diffusion layer 34 are formed on the front surface of the well region 20. A contact plug 35 is formed on the diffusion layer 33. A wiring layer 36, which functions as the source line SL, is formed on the contact plug 35. The source line SL is connected to a source line driver (not illustrated). A contact plug 37 is formed on the diffusion layer 34. A wiring layer 38, which functions as a well wiring CPWELL, is formed on the contact plug 37. The well wiring CPWELL is connected to a well driver (not illustrated). The wiring layers 36 and 38 are formed in a layer, which is upper than the select gate line SGD and is lower than the wiring layer 32. However, this structure is an example, and the structure is not limited thereto.

A plurality of the above-described configurations is arranged in a depth direction of a surface of paper illustrating FIG. 7. A set of a plurality of NAND strings 131 which are arranged to be parallel to the depth direction configures a string unit SU. The wiring layers 27, which function as a plurality of select gate lines SGS included in the same string unit SU, are commonly connected to each other. That is, the gate insulating film 30 is also formed on the well region 20 between the adjacent NAND strings 131. The wiring layer 27 and the gate insulating film 30 which are adjacent to the diffusion layer 33 are formed up to the vicinity of the diffusion layer 33.

Thus, when the selection transistor ST2 is in an ON state, the channel of the selection transistor ST2 electrically connects the memory cell transistor MT0 and the diffusion layer 33. A voltage is applied to the well wiring CPWELL, and thus a potential may be applied to the conductive film 31.

The configuration of the memory cell array 119 may vary. That is, the configuration of the memory cell array 119 is disclosed in, for example, U.S. patent application Ser. No. 12/407,403 filed on Mar. 19, 2009, of which the title is "Three dimensional stacked nonvolatile semiconductor memory". The configuration of the memory cell array 119 is disclosed in U.S. patent application Ser. No. 12/406,524 filed on Mar. 18, 2009, of which the title is "Three dimensional stacked nonvolatile semiconductor memory"; U.S. patent application Ser. No. 12/679,991 filed on Mar. 25, 2010, of which the title is "Non-volatile semiconductor storage device and method of manufacturing the same"; and U.S. patent application Ser. No. 12/532,030 filed on Mar. 23, 2009, of which the title is "Semiconductor memory and method for manufacturing same". The entire content of these patent applications is incorporated as references in the specification of the present disclosure.

Next, access processing to data stored in the nonvolatile memory 100 of the memory system according to the first embodiment will be described.

In the memory system according to the first embodiment, when the memory system 1 receives, for example, a read request, a write request, a data erasure request, a data removal request such as a trim command, from the host device 2, or when the memory controller 200 performs garbage collection, refreshment, wear leveling, patrol read, and the like in the background, the memory controller 200 accesses the nonvolatile memory 100.

The garbage collection may be also referred to as compaction. In the nonvolatile memory 100, an erasure unit of data is different from a reading unit of data. Thus, if rewriting of the nonvolatile memory 100 proceeds, invalid data may cause fragmentation of a block. If the number of such fragmented blocks is increased, the number of available blocks is decreased. The garbage collection is processing for increasing the number of available blocks. For example, the garbage collection means processing in which pieces of valid data are collected from a plurality of active blocks in which valid data and invalid data are included, and are rewritten in other blocks, and thus free blocks are ensured.

An active block indicates a block in which valid data are recorded. A free block indicates a block in which no valid data are recorded. The free block may be subjected to erasure, and then be used as a block in which erasure is completed. In the present embodiment, the free block includes both of a block before erasure, in which valid data are not recorded, and a block for which erasure is completed.

The valid data mean data correlated with a logical address, and invalid data mean data which are not correlated with a logical address. The block for which erasure is completed functions as an active block if data are written.

The refreshment is processing, for example, in which data in a certain block are rewritten in another block when degradation of data in this block is detected as with a case where the number of correction bits in error correction processing is increased.

The wear leveling is processing, for example, in which data stored in a block in which the number of times of rewriting or the number of times of erasure is large is replaced with data stored in a block in which the number of times of rewriting or the number of times of erasure is small, and thus the number of times of rewriting in a block of the nonvolatile memory 100 is leveled.

The patrol read is processing for detecting a block in which the number of occurrences of an error is increased. For example, in this processing, data stored in the nonvolatile memory 100 are read for each predetermined unit, and the read data are tested based on an error correction result in the decoding circuit 242. In this test processing, for example, the number of error bits in read data is compared to a threshold value, and data in which the number of error bits exceeds the threshold value is set as a target of the refreshment.

In the following descriptions, processing of the memory system 1 when a read request is received from the host device 2, processing of the memory system 1 when a data write request is received from the host device 2, and processing of the memory system 1 when it is determined that the memory controller 200 erases a predetermined block of the nonvolatile memory 100 will be described as examples of the access processing (performed by the memory controller 200) to data stored in the nonvolatile memory 100.

Figure 8:
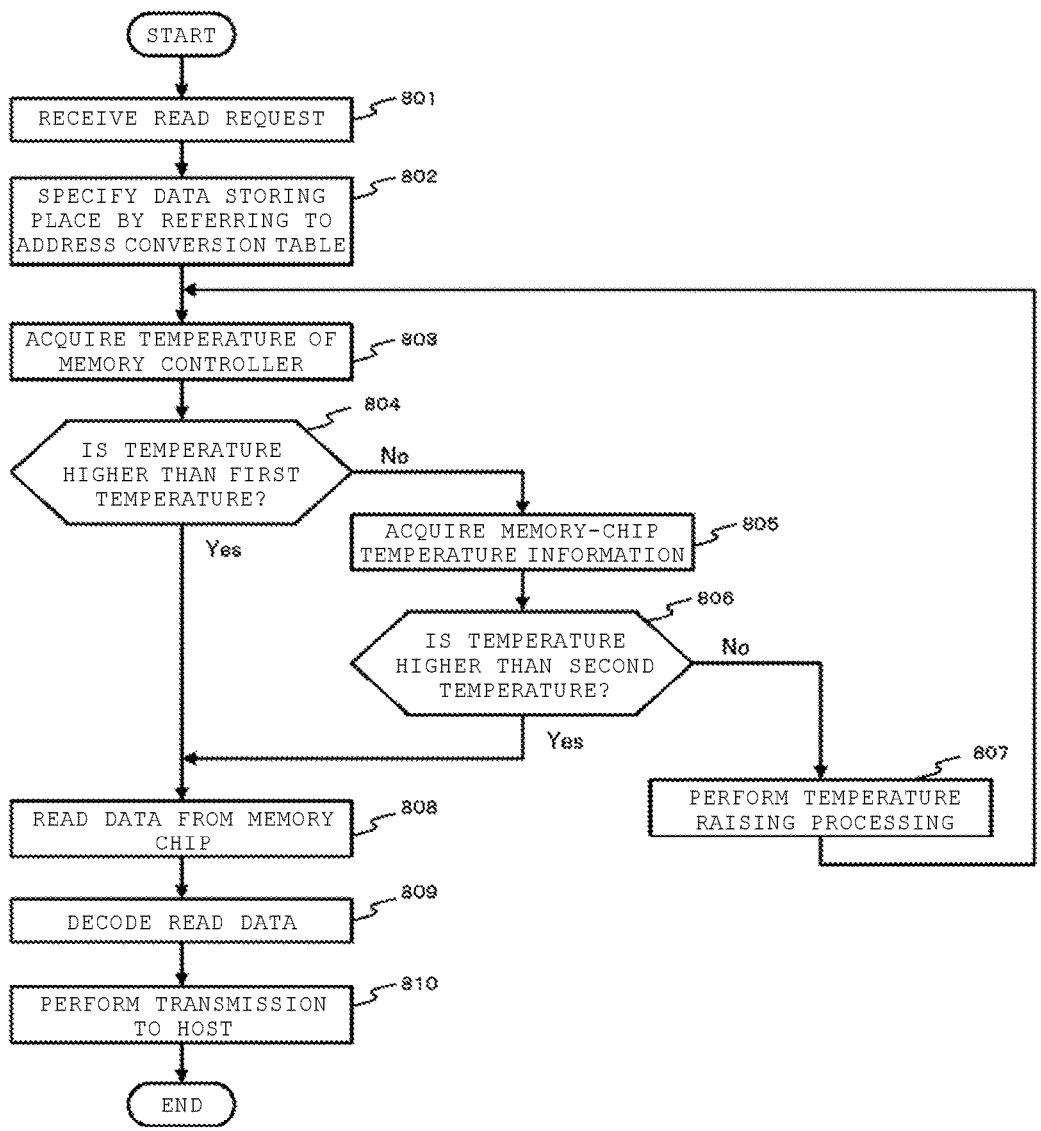
FIG. 8 is a flowchart illustrating processing carried out in response to a read request in the memory system according to the first embodiment.

FIG. 8 is a flowchart of reading processing of data from the nonvolatile memory 100 in response to a read request from the host device 2 in the memory system according to the first embodiment. The flowchart illustrates processing in which a read request is received from the host device 2, data corresponding to the request are read from the nonvolatile memory 100, and a read result is transmitted to the host device 2.

The quantity of data desired to be read from the memory system 1, address information indicating a reading position of the data, and the like are designated in the above-described read request. The memory system 1 determines whether or not reception of the read request is allowed. When reception of the read request is allowed, the read request may be received from the host device 2. These procedures are omitted in the flowchart in FIG. 8. Descriptions will focus on steps after the memory controller 200 of the memory system 1 receives a read request from the host device 2 via the host I/F 210, on the assumption that the reception of the read request is allowed.

If the memory controller 200 receives a read request from the host device 2 (Step 801), the control unit 220 of the memory controller 200 converts a logical address, which is an address designated in the read request, into a physical address. The conversion is performed by referring to the address conversion table to specify a storage place of data as a target of the read request. Then, the control unit 220 determines a memory chip 110 and a physical address to which access may be performed in order to process the read request from the host device 2 (Step 802).

In the present embodiment, it is assumed that a memory chip 110 which is an access destination corresponding to the logical address which is designated in the read request from the host device 2 is the memory chip 110-1.

Then, the control unit 220 of the memory controller 200 acquires the temperature of the memory controller 200 through the temperature sensor I/F 260 (Step 803).

Then, the control unit 220 of the memory controller 200 determines whether or not the temperature of the memory controller 200 is higher than a predetermined first temperature (Step 804).

When the temperature of the memory controller 200 is not higher than the predetermined first temperature (No in Step 804), the control unit 220 of the memory controller 200 instructs the memory I/F 250 to read memory-chip temperature information from the memory chip 110-1 as an access destination. The control unit 220 acquires the memory-chip temperature information from the memory chip 110-1 via the memory I/F 250 (Step 805).

The control unit 220 of the memory controller 200 transmits a command to the memory chip 110-1 via the memory I/F 250, in order to acquire the memory-chip temperature information from the memory chip 110-1.

Figure 9:
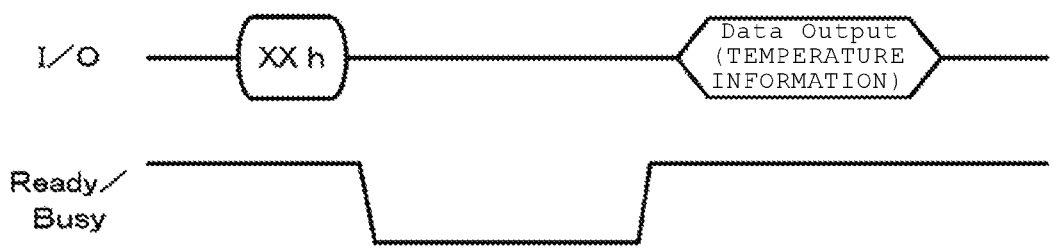
FIG. 9 is an example of a command sequence transmitted from a memory controller to a memory chip in the memory system according to the first embodiment.

FIG. 9 illustrates an example of a command sequence indicating a signal transmitted to the memory chip 110 from the memory controller 200 via the memory I/F 250 in order to acquire memory-chip temperature information of the memory chip 110. FIG. 9 illustrates only a signal transmitted as the input and output signal I/O, and an R/B signal indicating a ready or busy state of the memory chip 110-1. Illustrations of other signals /CE, ALE, CLE, /WE, and /RE are omitted in FIG. 9.

As illustrated in FIG. 9, if the memory controller 200 transmits a memory-chip temperature information acquisition command (XXh) as the input and output signal I/O, the memory chip 110 turns into a busy state, and the R/B signal has an "L" level. Thus, an acquisition operation of memory-chip temperature information is started in the memory chip 110. If the memory-chip temperature information of the memory chip 110 is output to the memory controller 200, and the memory chip 110 returns to a ready state, the R/B signal has an "H" level. As a result, temperature information of the memory chip is read by the memory controller 200.

The operation described in FIG. 9 is performed only for one memory chip 110. That is, for example, the memory controller 200 issues a memory-chip temperature information acquisition command for each of the memory chip 110-1, . . . , and the memory chip 110-N. Thus, the memory controller 200 can acquire temperature information of each of the memory chip 110-1, . . . , and the memory chip 110-N, and can recognize the temperature of each of the memory chip 110-1, . . . , and the memory chip 110-N.

The control unit 220 of the memory controller 200 determines the temperature of the memory chip 110-1 from the memory-chip temperature information which is acquired from the memory chip 110-1, and determines whether or not the temperature of the memory chip 110-1 is higher than a predetermined second temperature (Step 806). The predetermined second temperature may be equal to the predetermined first temperature or may be different from the predetermined first temperature.

When the temperature of the memory chip 110-1 is not higher than the predetermined second temperature (No in Step 806), the control unit 220 of the memory controller 200 performs temperature raising processing (Step 807).

The temperature raising processing is processing of raising the temperature of the memory controller 200 and the temperature of the memory chip 110. The temperature raising processing may be performed, for example, in such a manner that the control unit 220 of the memory controller 200 drives a temperature raising unit (not illustrated) such as a heater or in such a manner that the control unit 220 of the memory controller 200 drives the encoder and decoder 240. As long as the temperature of the memory controller 200 and the temperature of the memory chip 110 in the memory system 1 are raised, the control unit 220 of the memory controller 200 may perform processing other than driving of the temperature raising unit or driving of the encoder and decoder 240. If the temperature raising unit is mounted on the memory system 1, the temperature raising unit may be mounted on the board 400. The temperature raising unit may be also referred to as a temperature raising circuit, a temperature raising device, and a temperature raising module.

Here, driving of the encoder and decoder 240 includes driving of the encoding circuit 241 without driving of the decoding circuit 242, driving of the encoding circuit 241 and the decoding circuit 242 together, and driving of the decoding circuit 242 without driving of the encoding circuit 241.

Driving of the encoding circuit 241 means, for example, that dummy data are output to the encoding circuit 241, and the dummy data encoded by the encoding circuit 241 are discarded (ignored). Here, the dummy data may mean data which are not written into the memory chip 110 as user data. The dummy data may have any value of all zeros, all ones, and the like.

Driving of the decoding circuit 242 means, for example, that dummy data are output to the decoding circuit 242, and a decoding result obtained by the decoding circuit 242 is discarded (ignored). Here, the dummy data may also mean data which are not written into the memory chip 110 as user data. The dummy data may also have any value of all zeros, all ones, and the like. Here, when the decoding circuit 242 can decode dummy data, data after decoding the dummy data are used as a decoding result. In addition, when decoding of the decoding circuit 242 is not possible, that is, when the decoding circuit 242 fails in error correction, error correction failure is used as the decoding result.

The process returns to Step 803 after the control unit 220 of the memory controller 200 performs the temperature raising processing (Step 807). The control unit 220 acquires the temperature of the memory controller 200 again via the temperature sensor I/F 260 (Step 803).

When the temperature of the memory controller 200 is higher than the predetermined first temperature (Yes in Step 804), or when the temperature of the memory chip 110-1 is higher than the predetermined second temperature (Yes in Step 806), the control unit 220 of the memory controller 200 instructs the memory I/F 250 to read data from the memory chip 110-1, and reads data from the memory chip 110-1 via the memory I/F 250 (Step 808).

Then, the memory controller 200 decodes data read from the memory chip 110-1 (Step 809). The control unit 220 of the memory controller 200 instructs the decoding circuit 242 to decode data read from the memory chip 110-1. The decoding circuit 242 decodes data for which an instruction from the control unit 220 is performed. The decoding circuit 242 outputs a decoding result to the control unit 220. That is, when error correction succeeds in decoding, the control unit 220 is notified of decoded data. When error correction fails in decoding, the control unit 220 is notified of error correction failure.

Then, the control unit 220 transmits user data, i.e., the decoded data, to the host device 2 via the host I/F 210 when error correction succeeds. The control unit 220 transmits a reading error to the host device 2 via the host I/F 210 when a notification of error correction failure is performed (Step 810).

In FIG. 8, the control unit 220 of the memory controller 200 does not read data from the memory chip 110-1 as long as the temperature of the memory controller 200 is not higher than the predetermined first temperature and the temperature of the memory chip 110-1 is not higher than the predetermined second temperature. However, if a timeout is detected, that is, if a predetermined period elapses, the control unit 220 of the memory controller 200 may transmit data read from the memory chip 110-1 and decoded to the host device 2. In addition, if the memory controller 200 detects a timeout, that is, if a predetermined period elapses, the memory controller 200 may transmit a reading error to the host device 2.

The predetermined period when the timeout is detected may be started at any timing. For example, the start timing of the predetermined period may be timing when the memory system 1 receives the read request from the host device 2, timing when the temperature raising processing is started, or the like.

Figure 10:
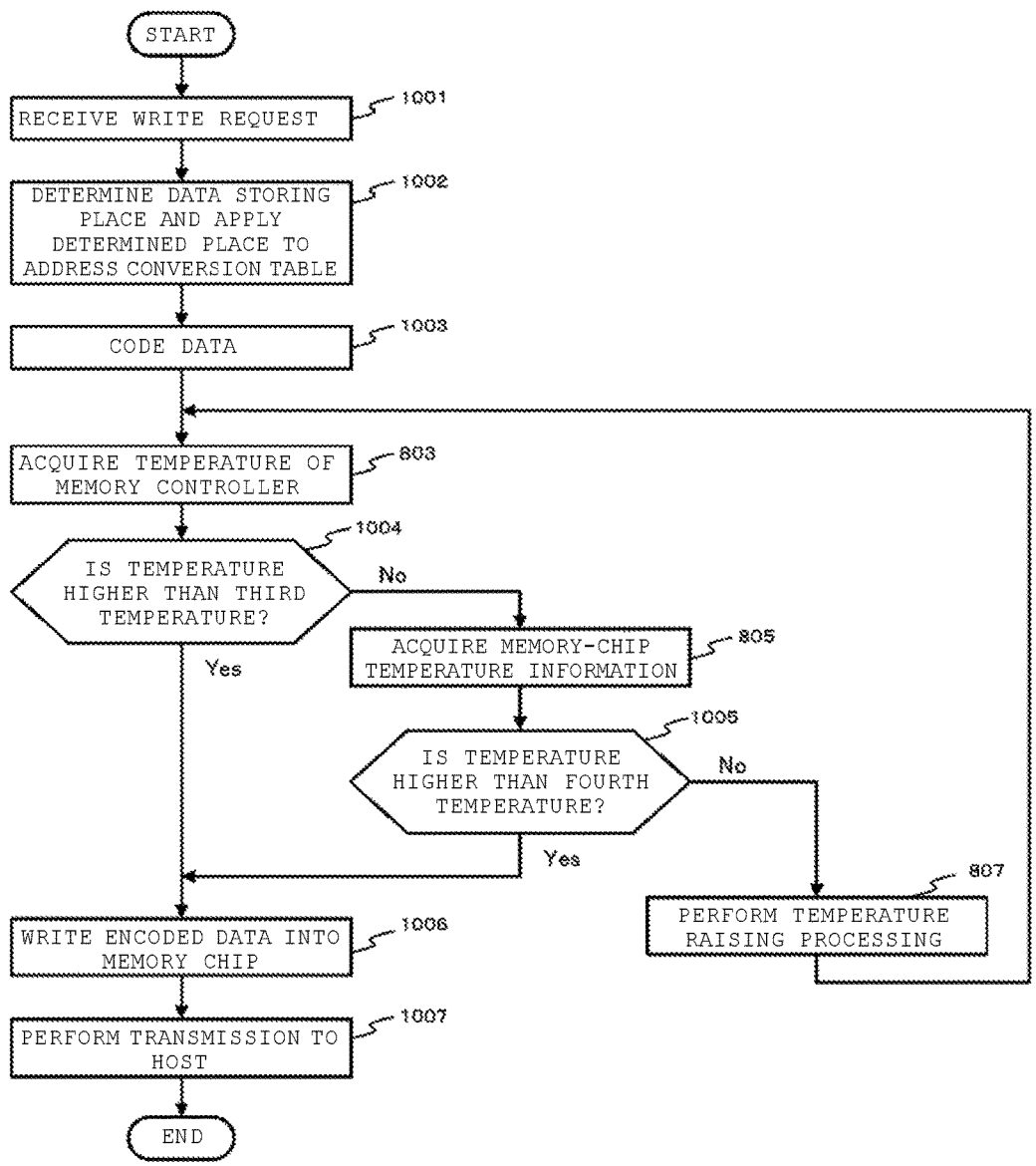
FIG. 10 is a flowchart illustrating processing carried out in response to a write request in the memory system according to the first embodiment.

FIG. 10 is a flowchart of writing processing of data into the nonvolatile memory 100 in response to a write request from the host device 2 in the memory system 1 according to the first embodiment. This flowchart illustrates processing in which a data write request is received from the host device 2, data designated in the write request are written into the nonvolatile memory 100, and a write result is transmitted to the host device 2. Steps in FIG. 10, which are the same as those in FIG. 8 are denoted by the same reference signs.

In the above-described write request, user data, address information of the user data, or the like is designated. The memory system 1 determines whether or not reception of a write request is allowed. When the reception of the write request is allowed, the memory system 1 may receive the write request from the host device 2. These procedures are omitted in FIG. 10. Descriptions will focus on steps after the memory controller 200 of the memory system 1 receives a write request from the host device 2 via the host I/F 210, on the assumption that the reception of the write request is allowed.

If the write request is received from the host device 2 (Step 1001), the control unit 220 of the memory controller 200 determines a physical address corresponding to a logical address designated in the write request, and applies the determined physical address to the address conversion table (Step 1002). The control unit 220 of the memory controller 200 instructs the encoding circuit 241 to code user data, which are a write target designated in the write request. The encoding circuit 241 codes the user data which are a write target (Step 1003).

In the present embodiment, it is assumed that a memory chip 110 corresponding to a physical address determined for a logical address designated in the write request from the host device 2 is the memory chip 110-1.

Then, the control unit 220 of the memory controller 200 acquires the temperature of the memory controller 200 via the temperature sensor I/F 260 (Step 803).

Then, the control unit 220 of the memory controller 200 determines whether or not the temperature of the memory controller 200 is higher than a predetermined third temperature (Step 1004). The predetermined third temperature may be equal to the predetermined first temperature or may be different from the predetermined first temperature.

When the temperature of the memory controller 200 is not higher than the predetermined third temperature (No in Step 1004), the control unit 220 of the memory controller 200 instructs the memory I/F 250 to read memory-chip temperature information in order to acquire the memory-chip temperature information of the memory chip 110-1 as an access destination. The control unit 220 acquires the memory-chip temperature information from the memory chip 110-1 via the memory I/F 250 (Step 805). Memory-chip temperature information acquisition processing from the memory chip 110-1 by the control unit 220 of the memory controller 200 is similar to processing performed when the control unit 220 receives a read request from the host device 2.

The control unit 220 of the memory controller 200 determines the temperature of the memory chip 110-1 based on the memory-chip temperature information acquired from the memory chip 110-1. Then, the control unit 220 determines whether or not the temperature of the memory chip 110-1 is higher than a predetermined fourth temperature (Step 1005).

The predetermined fourth temperature may be equal to the predetermined second temperature or may be different from the predetermined second temperature. The predetermined fourth temperature may be equal to the predetermined third temperature or may be different from the predetermined third temperature.

When the temperature of the memory chip 110-1 is not higher than the predetermined fourth temperature (No in Step 1005), the control unit 220 of the memory controller 200 performs temperature raising processing (Step 807).

The process returns to Step 803 after the control unit 220 of the memory controller 200 performs the temperature raising processing (Step 807). The control unit 220 acquires the temperature of the memory controller 200 again via the temperature sensor I/F 260 (Step 803).

When the encoder and decoder 240 is driven for performing the temperature raising processing, similar to a case where the memory system 1 reads data from the nonvolatile memory 100 in response to a read request from the host device 2, the control unit 220 of the memory controller 200 may not drive only the encoding circuit 241, but may drive the encoding circuit 241 and the decoding circuit 242 together. The control unit 220 may drive the decoding circuit 242 without driving the encoding circuit 241.

When the temperature of the memory controller 200 is higher than the predetermined third temperature (Yes in Step 1004), or when the temperature of the memory chip 110-1 is higher than the predetermined fourth temperature (Yes in Step 1005), the control unit 220 of the memory controller 200 instructs the memory I/F 250 to write the encoded data into the memory chip 110-1, and writes data into the memory chip 110-1 via the memory I/F 250 (Step 1006).

Then, the memory controller 200 transmits a result of writing data into the memory chip 110-1, to the host device 2 via the host I/F 210 (Step 1007).

In FIG. 10, if the temperature of the memory controller 200 is not higher than the predetermined third temperature and the temperature of the memory chip 110-1 is not higher than the predetermined fourth temperature, the control unit 220 of the memory controller 200 does not write data into the memory chip 110-1. However, if the memory controller 200 detects a timeout, that is, if a predetermined period elapses, the control unit 220 of the memory controller 200 may write encoded data into the memory chip 110-1. In addition, if the memory controller 200 detects a timeout, that is, if a predetermined period elapses, the memory controller 200 may transmit a writing error to the host device 2.

The predetermined period when the timeout is detected may be started at any timing. For example, the start timing of the predetermined period may be timing when the memory system 1 receives the write request from the host device 2, timing when the temperature raising processing is started, or the like.

Figure 11:
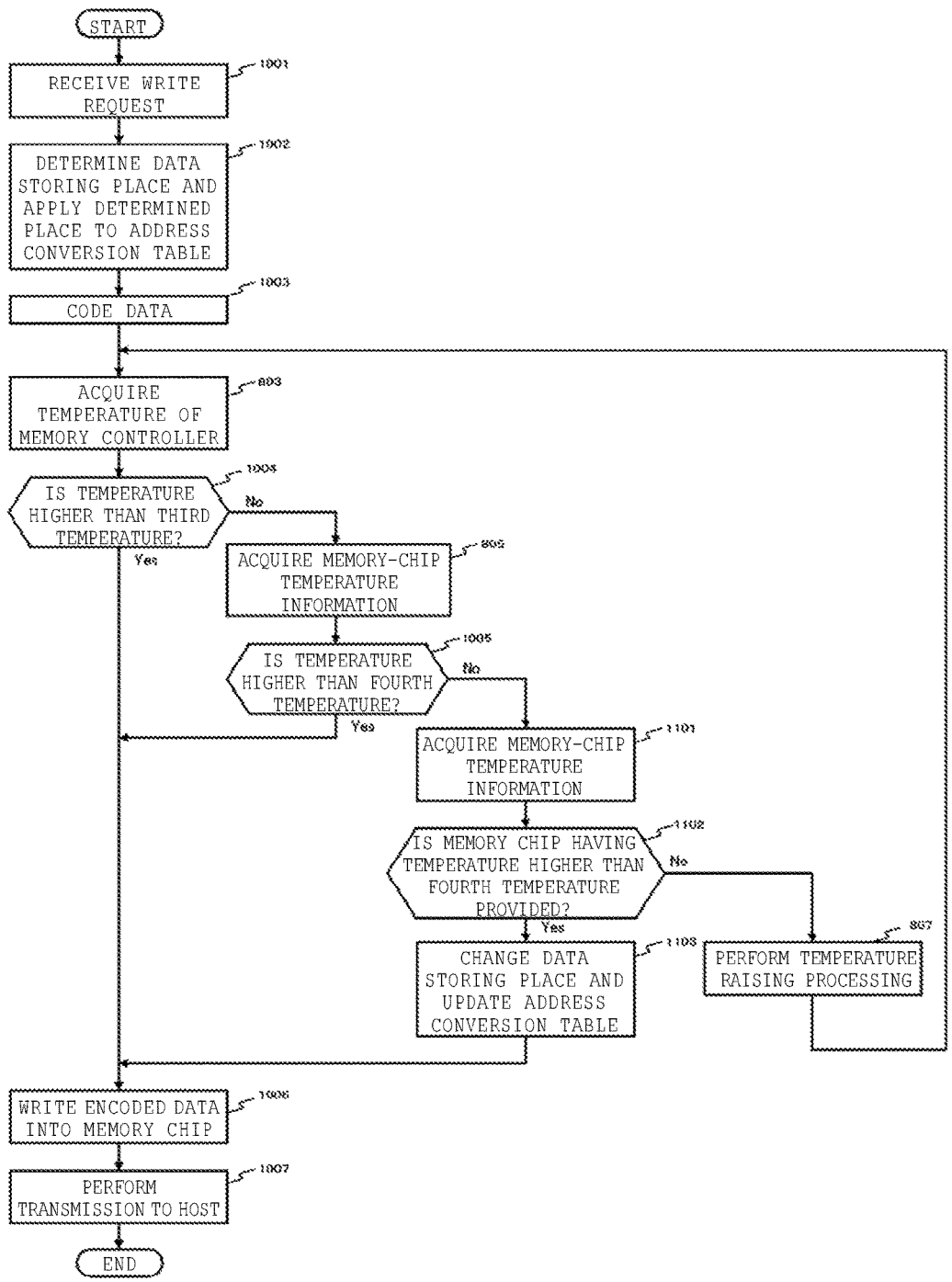
FIG. 11 is a flowchart illustrating a modification example of the processing carried out in response to the write request in the memory system according to the first embodiment.

FIG. 11 is a flowchart of a modification example of the processing in which data are written into the nonvolatile memory 100 in response to a write request from the host device 2 in the memory system according to the first embodiment. This flowchart illustrates processing in which a data write request is received from the host device 2, user data designated in the write request are written into the nonvolatile memory 100, and a write result is transmitted to the host device 2. Steps in FIG. 11, which are the same as those in FIGS. 8 and 10 are denoted by the same reference signs.

In the memory system according to the modification example, when the temperature of the memory chip 110 is not higher than the predetermined fourth temperature (No in Step 1005), the control unit 220 of the memory controller 200 does not perform the temperature raising processing, and acquires temperatures of the memory chip 110-2, . . . , and the memory chip 110-N which are memory chips 110 other than the memory chip 110-1 (Step 1101).

The control unit 220 of the memory controller 200 determines whether a memory chip which has a temperature higher than the predetermined fourth temperature is provided among the memory chip 110-2, . . . , and the memory chip 110-N(Step 1102).

When the memory chip having a temperature higher than the predetermined fourth temperature is not provided (No in Step 1102), the control unit 220 of the memory controller 200 performs the temperature raising processing (Step 807). Then, the process returns to Step 803, and the control unit 220 acquires the temperature of the memory controller 200 again via the temperature sensor I/F 260 (Step 803).

When the memory chip having a temperature higher than the predetermined fourth temperature is provided (Yes in Step 1102), the control unit 220 of the memory controller 200 changes a physical address corresponding to a logical address which is designated in a write request, and applies the changed physical address to the address conversion table (Step 1103).

In the modification example, it is assumed that a memory chip 110 corresponding to the changed physical address is the memory chip 110-2, that is, a memory chip 110 having a temperature higher than the fourth temperature among the memory chip 110-2, . . . , and the memory chip 110-N is the memory chip 110-2.

When the control unit 220 applies the changed physical address to the address conversion table (Step 1103), the control unit 220 of the memory controller 200 changes the address conversion table so as to cause the changed physical address to be a physical address corresponding to the memory chip 110-2.

After the control unit 220 applies the changed physical address to the address conversion table (Step 1103), the control unit 220 of the memory controller 200 instructs the memory I/F 250 to write encoded data into the memory chip 110-2, and writes data into the memory chip 110-2 via the memory I/F 250 (Step 1006).

Then, the memory controller 200 transmits a result of writing data into the memory chip 110-2, to the host device 2 via the host I/F 210 (Step 1007).

When the temperature of the memory controller 200 is higher than the predetermined third temperature (Yes in Step 1004), or when the temperature of the memory chip 110-1 is higher than the predetermined fourth temperature (Yes in Step 1005), the control unit 220 of the memory controller 200 instructs the memory I/F 250 to write the encoded data into the memory chip 110-1, and writes data into the memory chip 110-1 via the memory I/F 250 (Step 1006). The memory controller 200 transmits a result of writing data into the memory chip 110-1, to the host device 2 via the host I/F 210 (Step 1007).

In the modification example, the physical address corresponding to the logical address which is designated in the write request from the host device 2 is determined before the memory-chip temperature information is acquired (Step 1002). However, the physical address corresponding to the logical address which is designated in the write request from the host device 2 may not be determined before the memory-chip temperature information is acquired, but memory-chip temperature information may be acquired, and a physical address corresponding to a logical address which is designated in a write request may be determined based on the acquired memory-chip temperature information.

That is, in the modification example, memory-chip temperature information of the memory chip 110-1, . . . , and the memory chip 110-N may be acquired. When the temperature of the memory chip 110-1 is not higher than the predetermined fourth temperature, but the temperature of the memory chip 110-2 is higher than the predetermined fourth temperature, the memory chip 110-2 may be determined as a memory chip 110 of a data writing destination, and a physical address corresponding to the memory chip 110-2 may be applied to the address conversion table.

Figure 12:
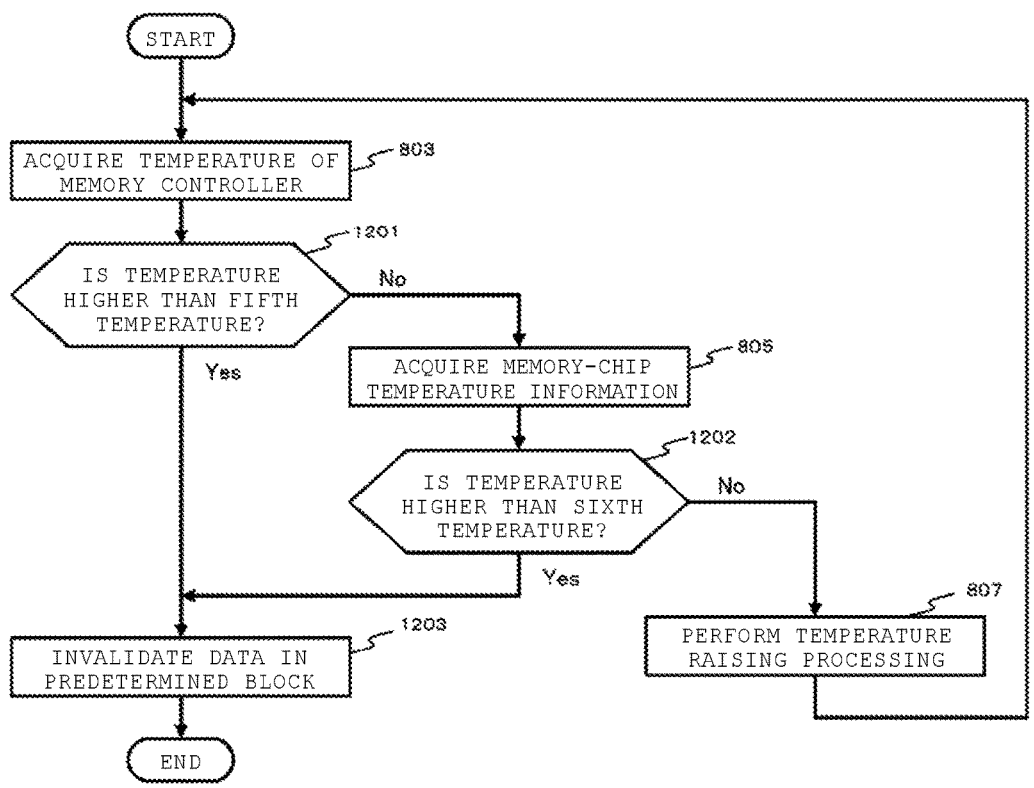
FIG. 12 is a flowchart illustrating erasing (invalidating) processing of a predetermined block carried out in a nonvolatile memory of the memory system according to the first embodiment.

FIG. 12 is a flowchart illustrating the processing of erasing data in a predetermined block in the nonvolatile memory 100 of the memory system according to the first embodiment. In FIG. 12, descriptions will focus on steps after the memory controller 200 determines to erase a predetermined block of the nonvolatile memory 100. Steps in FIG. 12, which are the same as those in FIG. 8 are denoted by the same reference signs.

In the present embodiment, it is assumed that a memory chip 110 including a predetermined block which is set as an erasure target is the memory chip 110-1.

The control unit 220 of the memory controller 200 acquires the temperature of the memory controller 200 via the temperature sensor I/F 260 (Step 803).

Then, the control unit 220 of the memory controller 200 determines whether or not the temperature of the memory controller 200 is higher than a predetermined fifth temperature (Step 1201). The predetermined fifth temperature may be equal to the predetermined first temperature or the predetermined third temperature, or may be different from the predetermined first temperature or the predetermined third temperature.

When the temperature of the memory controller 200 is not higher than the predetermined fifth temperature (No in Step 1201), the control unit 220 of the memory controller 200 instructs the memory I/F 250 to read memory-chip temperature information in order to acquire the memory-chip temperature information of the memory chip 110-1 as an access destination. The control unit 220 acquires the memory-chip temperature information from the memory chip 110-1 via the memory I/F 250 (Step 805). Acquisition of the memory-chip temperature information from the memory chip 110-1 by the control unit 220 of the memory controller 200 is similar to processing performed when the control unit 220 receives a read request from the host device 2.

The control unit 220 of the memory controller 200 determines the temperature of the memory chip 110-1 based on the memory-chip temperature information acquired from the memory chip 110-1. Then, the control unit 220 determines whether or not the temperature of the memory chip 110-1 is higher than a predetermined sixth temperature (Step 1202).

The predetermined sixth temperature may be equal to the predetermined second temperature or the predetermined fourth temperature, or may be different from the predetermined second temperature or the predetermined fourth temperature. The predetermined sixth temperature may be equal to the predetermined fifth temperature or may be different from the predetermined fifth temperature.

When the temperature of the memory chip 110-1 is not higher than the predetermined sixth temperature (No in Step 1202), the control unit 220 of the memory controller 200 performs temperature raising processing (Step 807).

The process returns to Step 803 after the control unit 220 of the memory controller 200 performs the temperature raising processing (Step 807). The control unit 220 acquires the temperature of the memory controller 200 again via the temperature sensor I/F 260 (Step 803).

When the encoder and decoder 240 is driven to perform the temperature raising processing, similarly to a case where the memory system 1 reads data from the nonvolatile memory 100 in response to a read request from the host device 2, the control unit 220 of the memory controller 200 may not drive only the encoding circuit 241, but may drive the encoding circuit 241 and the decoding circuit 242 together. The control unit 220 may drive the decoding circuit 242 without driving the encoding circuit 241.

When the temperature of the memory controller 200 is higher than the predetermined fifth temperature (Yes in Step 1201) or when the temperature of the memory chip 110-1 is higher than the predetermined sixth temperature (Yes in Step 1202), the control unit 220 of the memory controller 200 instructs the memory I/F 250 to erase a predetermined block (Step 1203).

Then, the memory controller 200 may apply a block erasure result for the memory chip 110-1, to a management table for managing the erased block.

In FIG. 12, if the temperature of the memory controller 200 is not higher than the predetermined fifth temperature and the temperature of the memory chip 110-1 is not higher than the predetermined sixth temperature, the control unit 220 of the memory controller 200 does not erase a block of the memory chip 110-1. However, if the memory controller 200 detects a timeout, that is, if a predetermined period elapses, the control unit 220 of the memory controller 200 may erase a predetermined block of the memory chip 110-1. In addition, if the memory controller 200 detects a timeout, that is, if a predetermined period elapses, the memory controller 200 may not perform erasure of a predetermined block of the memory chip 110-1.

The predetermined period when the timeout is detected may be started at any timing. For example, the start timing of the predetermined period may be timing when the memory controller 200 determines to erase a predetermined block of the nonvolatile memory 100, timing when the temperature raising processing is started, or the like.

As described above, according to the first embodiment, in the memory system 1, when the temperature of the memory controller 200 is not higher than the predetermined temperature, and the temperature of the memory chip 110 which is an access destination is not higher than the predetermined temperature, the memory controller 200 performs the temperature raising processing in order to raise the temperature of the memory controller 200 or the temperature of the memory chip 110. After the temperature raising processing is performed, when the temperature of the memory controller 200 becomes higher than the predetermined temperature or the temperature of the memory chip 110 which is an access destination becomes higher than the predetermined temperature, the memory controller 200 accesses the memory chip 110.

In the memory system according to the first embodiment, when the temperature of the memory controller 200 or the temperature of the memory chip 110 is not higher than the corresponding predetermined temperature, waiting is performed until the temperature of the memory controller 200 or the temperature of the memory chip 110 reaches the corresponding predetermined temperature, and then an access to the nonvolatile memory 110 is performed. Thus, even when the nonvolatile memory 110 is vulnerable in an operation at a low temperature (e.g., under 50-70° C.), it is possible to operate appropriately the memory cell of the nonvolatile memory 110. It is possible to improve reliability of data written in the nonvolatile memory 110 or data read from the nonvolatile memory 110. It is possible to reduce an occurrence frequency of the reading error from the nonvolatile memory 110 and the writing error in the nonvolatile memory 110.

Second Embodiment

Figure 13:
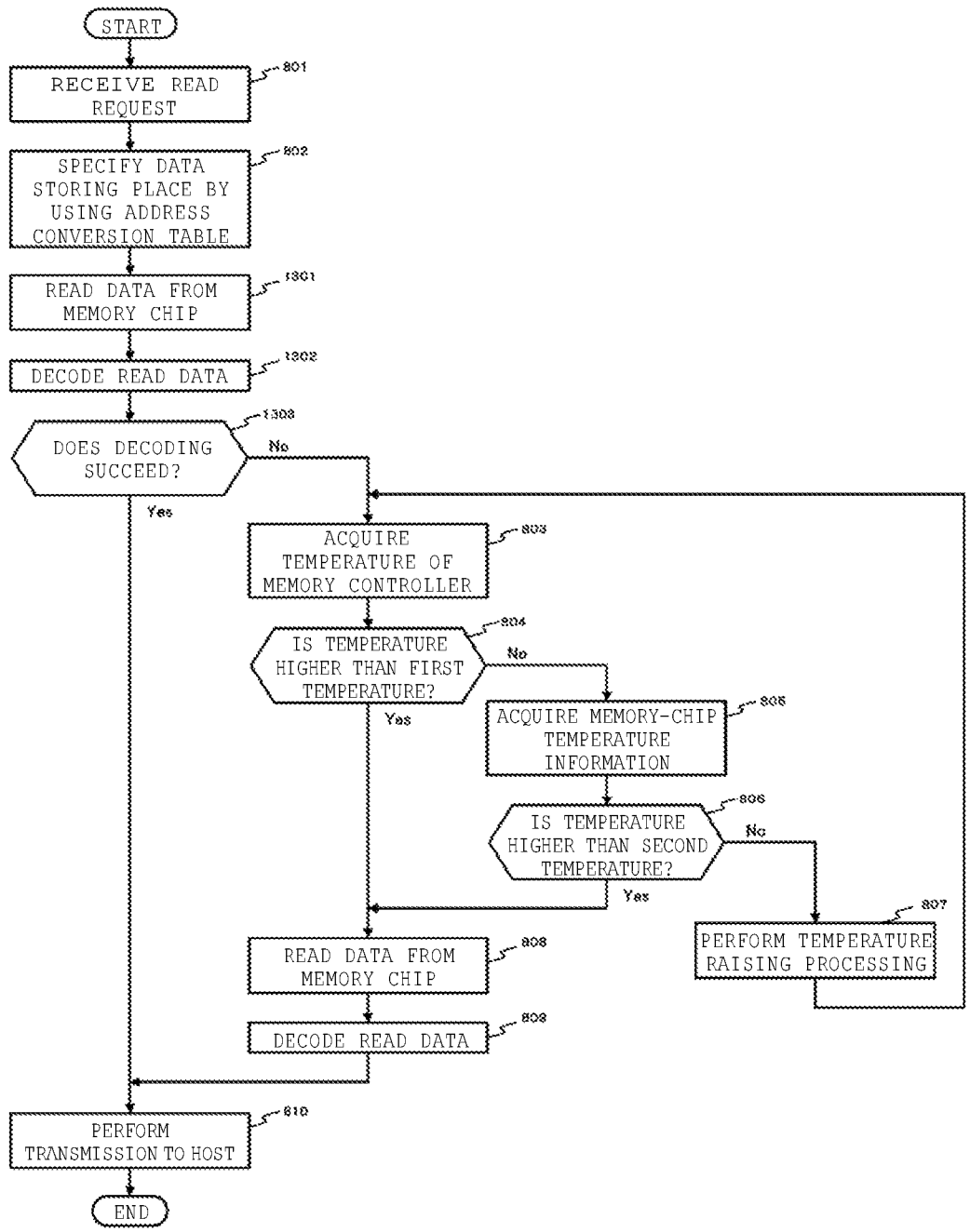
FIG. 13 is a flowchart illustrating processing carried out in response to a read request in a memory system according to a second embodiment.

FIG. 13 is a flowchart of reading processing of data from the nonvolatile memory 100 in response to a read request from the host device 2 in a memory system 1 according to a second embodiment. Steps in FIG. 13, which are the same as those in FIG. 8 are denoted by the same reference signs. In the present embodiment, descriptions for a configuration and an operation similar to those in the first embodiment will be omitted. A structure, a configuration, and the like of the memory system 1 in the present embodiment are similar to those in FIGS. 1 to 7.

In the present embodiment, similar to the first embodiment, it is assumed that a memory chip 110 which is an access destination corresponding to the logical address designated in the read request from the host device 2 is the memory chip 110-1.

The memory system according to the second embodiment is different from the memory system according to the first embodiment in that, after the processing (Step 802) in which the control unit 220 of the memory controller 200 converts a logical address designated in a read request, into a physical address, and the control unit 220 determines a memory chip 110 and a physical address to which access may be performed in order to process the read request from the host device 2, when data are read from the memory chip 110-1 and reading succeeds, that is, when decoding of read data is successful, the temperature of the memory controller 200 or the temperature of the memory chip 110 is not acquired, but the decoded data are transmitted to the host device 2.

If the control unit 220 of the memory controller 200 converts a logical address designated in a read request, into a physical address, and the control unit 220 determines a memory chip 110 and a physical address to which access may be performed in order to process the read request from the host device 2 (Step 802), the control unit 220 instructs the memory I/F 250 to read data from the memory chip 110-1 and reads data from the memory chip 110-1 via the memory I/F 250 (Step 1301).

The memory controller 200 decodes data read from the memory chip 110-1 (Step 1302). The control unit 220 of the memory controller 200 instructs the decoding circuit 242 to decode data read from the memory chip 110-1, and the decoding circuit 242 decodes data for which an instruction from the control unit 220 is performed. The decoding circuit 242 outputs a decoding result to the control unit 220. That is, when error correction succeeds in decoding, the control unit 220 is notified of decoded data. When error correction fails in decoding, the control unit 220 is notified of error correction failure.

When decoding by the decoding circuit 242 succeeds (Yes in Step 1303), that is, when error correction succeeds in decoding, the control unit 220 of the memory controller 200 transmits user data, i.e., the decoded data, to the host device 2 via the host I/F 210 (Step 810).

When decoding by the decoding circuit 242 fails (No in Step 1303), that is, when a notification of error correction failure is received from the decoding circuit 242, the control unit 220 of the memory controller 200 acquires the temperature of the memory controller 200 via the temperature sensor I/F 260 (Step 803), and performs processing similar to that in the memory system according to the first embodiment.

According to the second embodiment, in the memory system 1, similarly to the first embodiment, even when the nonvolatile memory 110 is weak in an operation at a low temperature, it is possible to improve reliability of data read from the nonvolatile memory 110.

According to the second embodiment, when reading from the memory chip 110 in response to a read request from the host device 2 succeeds, the processing of acquiring the temperature of the memory controller 200 and the temperature of the memory chip 110 is not performed. Thus, latency is reduced in comparison to a case where the temperature of the memory controller 200 and the temperature of the memory chip 110 are acquired.

Third Embodiment

Figure 14:
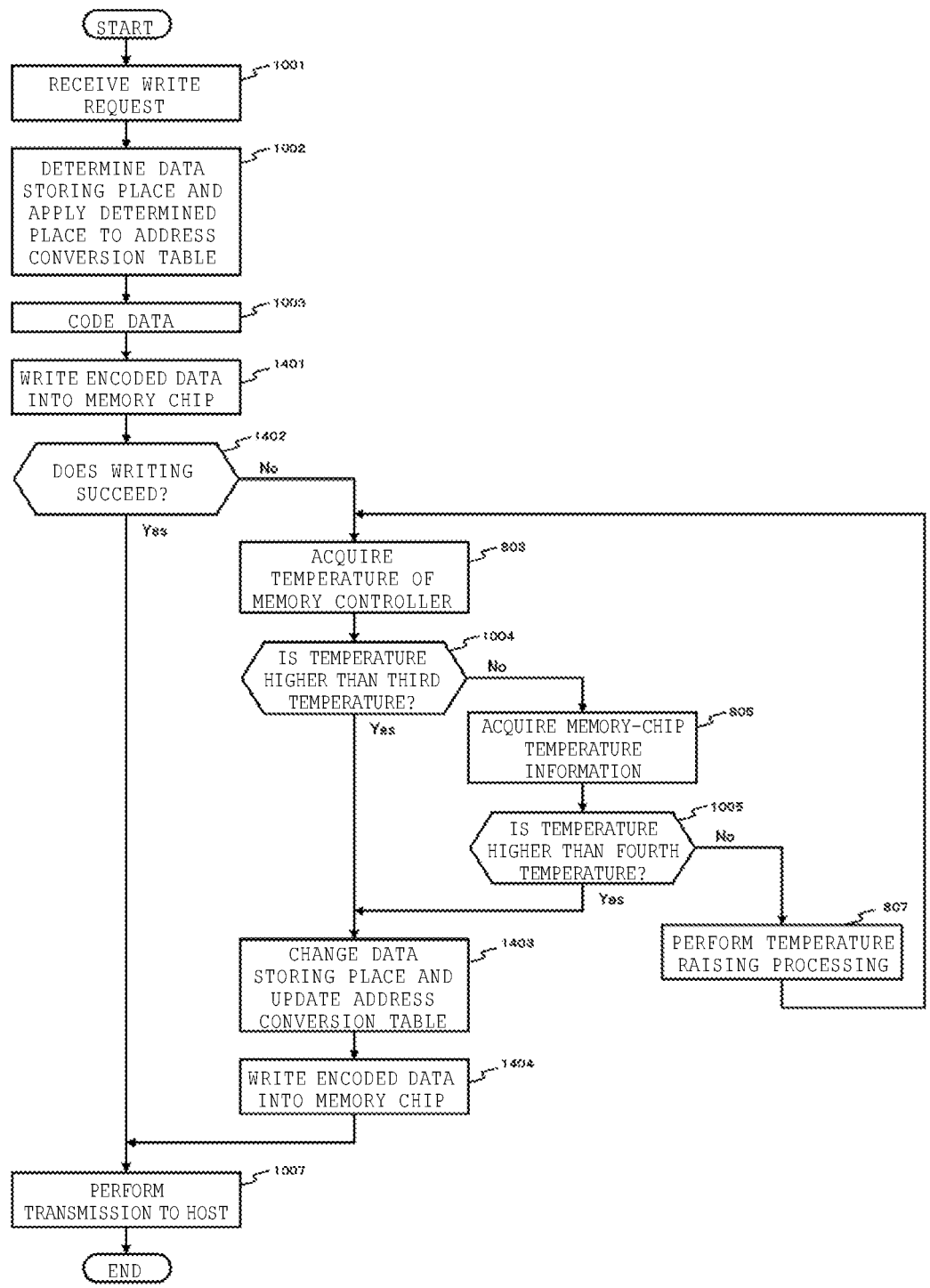
FIG. 14 is a flowchart illustrating processing carried out in response to a write request in a memory system according to a third embodiment.

FIG. 14 is a flowchart of a modification example of the processing in which data are written into the nonvolatile memory 100 in response to a data write request from the host device 2 in a memory system 1 according to a third embodiment. Steps in FIG. 14, which are the same as those in FIG. 10 are denoted by the same reference signs. In the present embodiment, descriptions for a configuration and an operation similar to those in the first embodiment will be omitted. A structure, a configuration, and the like of the memory system 1 in the present embodiment are similar to those in FIGS. 1 to 7.

In the present embodiment, similarly to the first embodiment, it is assumed that a memory chip 110 corresponding to a physical address determined for a logical address designated in a write request from the host device 2 is the memory chip 110-1.

A memory system according to the third embodiment is different from the memory system according to the first embodiment in that, after the control unit 220 of the memory controller 200 codes user data, which are a writing target designated in a write request (Step 1003), the control unit 220 writes encoded data in the memory chip 110-1, and when writing succeeds, a response indicating that writing succeeds is transmitted to the host device 2.

The control unit 220 of the memory controller 200 instructs the encoding circuit 241 to code user data, which are a writing target designated in a write request. After the encoding circuit 241 performs of encoding the user data (Step 1003), the control unit 220 of the memory controller 200 instructs the memory I/F 250 to write encoded data in the memory chip 110-1, and writes data into the memory chip 110-1 via the memory I/F 250 (Step 1401).

When writing into the memory chip 110-1 succeeds (Yes in Step 1402), the control unit 220 of the memory controller 200 transmits a response indicating that writing succeeds, to the host device 2 (Step 1007). The control unit 220 of the memory controller 200 determines whether or not the writing into the memory chip 110-1 succeeds, for example, based on a response output from the memory chip 110-1 via the memory I/F 250, to an instruction of writing data in the memory chip 110-1.

When the writing into the memory chip 110-1 does not succeed (No in Step 1402), the control unit 220 of the memory controller 200 acquires the temperature of the memory controller 200 via the temperature sensor I/F 260 (Step 803), and then performs processing which is similar to that carried out in the memory system according to the first embodiment except that data are written at a physical address other than the physical address which is a writing destination of data in Step 1401.

When the writing into the memory chip 110-1 does not succeed (No in Step 1402), the control unit 220 of the memory controller 200 acquires the temperature of the memory controller 200 via the temperature sensor I/F 260 (Step 803), and then determines whether or not the temperature of the memory controller 200 is higher than the predetermined third temperature (Step 1004).

When the temperature of the memory controller 200 is not higher than the predetermined third temperature (No in Step 1004), the control unit 220 of the memory controller 200 acquires the memory-chip temperature information from the memory chip 110-1 via the memory I/F 250 (Step 805).

The control unit 220 of the memory controller 200 specifies the temperature of the memory chip 110-1 based on the memory-chip temperature information which is acquired from the memory chip 110-1. The control unit 220 determines whether or not the temperature of the memory chip 110-1 is higher than a predetermined fourth temperature (Step 1005).

When the temperature of the memory chip 110-1 is not higher than the predetermined fourth temperature (No in Step 1005), the control unit 220 of the memory controller 200 performs the temperature raising processing (Step 807). Then, the process by the control unit 220 returns to Step 803, and acquires the temperature of the memory controller 200 again via the temperature sensor I/F 260 (Step 803).

When the temperature of the memory controller 200 is higher than the predetermined third temperature (Yes in Step 1004), or when the temperature of the memory chip 110-1 is higher than the predetermined fourth temperature (Yes in Step 1005), the control unit 220 of the memory controller 200 changes a physical address corresponding to a logical address designated in a write request, and applies the changed physical address to the address conversion table (Step 1403).

When the control unit 220 applies the changed physical address to the address conversion table (Step 1403), the control unit 220 of the memory controller 200 causes the changed physical address to be a physical address different from the physical address in which writing of data was performed in Step 1401.

Then, the control unit 220 of the memory controller 200 instructs the memory I/F 250 to write data at the physical address changed in Step 1403. The control unit 220 writes data into the memory chip 110-1 via the memory I/F 250 (Step 1404).

According to the third embodiment, in the memory system 1, similarly to the first embodiment, even when the nonvolatile memory 110 is not good at an operation at a low temperature, it is possible to improve reliability of data held in the nonvolatile memory 110.

According to the third embodiment, when writing into the memory chip 110 in response to a write request from the host device 2 succeeds, the processing of acquiring the temperature of the memory controller 200 and the temperature of the memory chip 110 is not performed. Thus, latency is reduced in comparison to a case where the temperature of the memory controller 200 and the temperature of the memory chip 110 are acquired.

Fourth Embodiment

Figure 15:
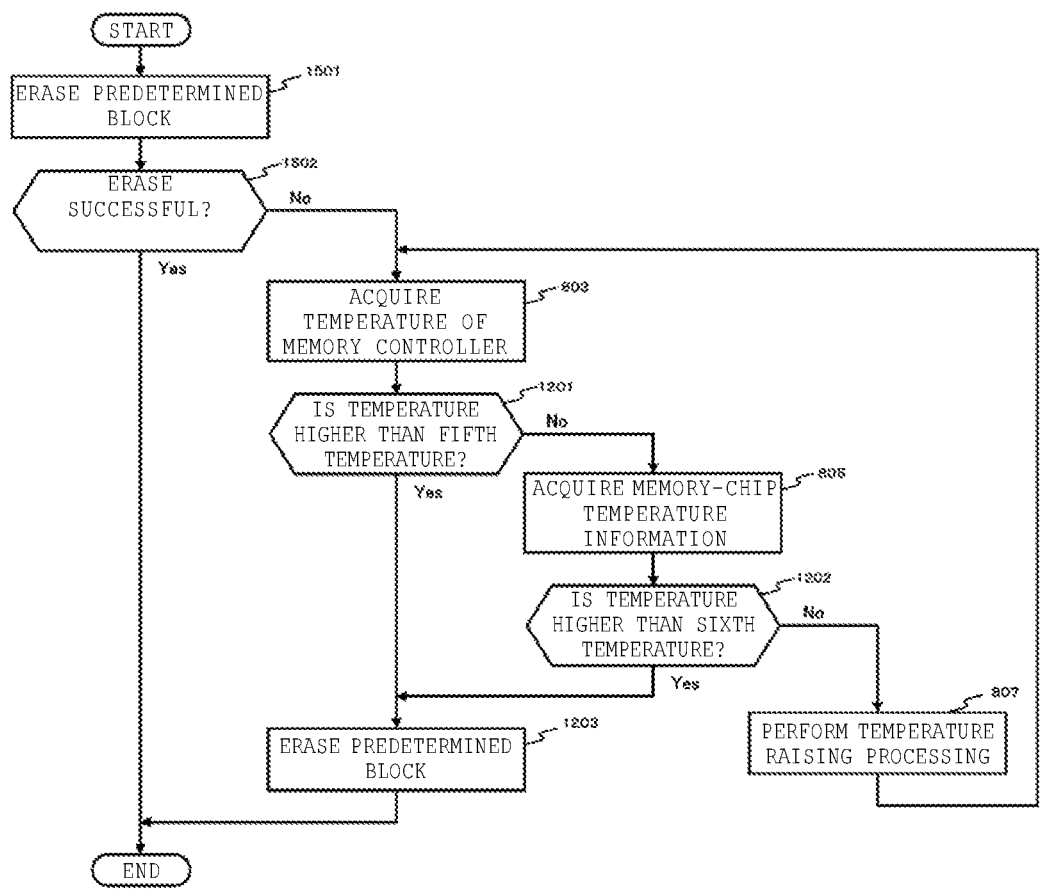
FIG. 15 is a flowchart illustrating erasing (invalidating) processing of a predetermined block carried out in a nonvolatile memory of a memory system according to a fourth embodiment.

FIG. 15 is a flowchart illustrating the processing of erasing data in a predetermined block in the nonvolatile memory 100 of a memory system 1 according to a fourth embodiment. In the flowchart in FIG. 15, descriptions will focus on steps after the memory controller 200 determines to erase a predetermined block of the nonvolatile memory 100. Steps in FIG. 15, which are the same as those in FIG. 12 are denoted by the same reference signs. In the present embodiment, descriptions for a configuration and an operation similar to those in the first embodiment will be omitted. A structure, a configuration, and the like of the memory system 1 in the present embodiment are similar to those in FIGS. 1 to 7.

In the present embodiment, it is assumed that a memory chip 110 including a predetermined block which is set as an erasure target is the memory chip 110-1.

The memory system according to the fourth embodiment is different from the memory system according to the first embodiment in that, after the control unit 220 of the memory controller 200 determines that the memory controller 200 erases a predetermined block of the nonvolatile memory 100, the control unit 220 erases the predetermined block without acquiring the temperature of the memory controller 200 and the like, and when erasure does not succeed, the temperature of the memory controller 200 and the like is acquired.

The control unit 220 of the memory controller 200 instructs the memory I/F 250 to erase a predetermined block (Step 1501).

The control unit 220 of the memory controller 200 determines whether or not erasure of a block in the memory chip 110-1 succeeds, for example, based on a response output from the memory chip 110-1 via the memory I/F 250, to an instruction of erasing a block in the memory chip 110-1 (Step 1502).

When erasure of a block in the memory chip 110-1 succeeds (Yes in Step 1502), the control unit 220 of the memory controller 200 ends the flowchart illustrated in FIG. 15. When erasure of a block in the memory chip 110-1 succeeds, the control unit 220 of the memory controller 200 may apply a block erasure result for the memory chip 110-1, to the management table for managing the erased block.

When erasure of a block in the memory chip 110-1 does not succeed (No in Step 1502), the control unit 220 of the memory controller 200 acquires the temperature of the memory controller 200 via the temperature sensor I/F 260 (Step 803), and then performs processing which is similar to that in the memory system according to the first embodiment.

According to the above-described fourth embodiment, in the memory system 1, similar to the first embodiment, even when the nonvolatile memory 100 is weak in an operation at a low temperature, it is possible to reduce stress in the memory cell of the nonvolatile memory 100.

According to the fourth embodiment, when erasure of a predetermined block succeeds, the processing of acquiring the temperature of the memory controller 200 and the temperature of the memory chip 110 are not performed. Thus, time to erase a block is reduced in comparison to a case where the temperature of the memory controller 200 and the temperature of the memory chip 110 are acquired.

Fifth Embodiment

Figure 16:
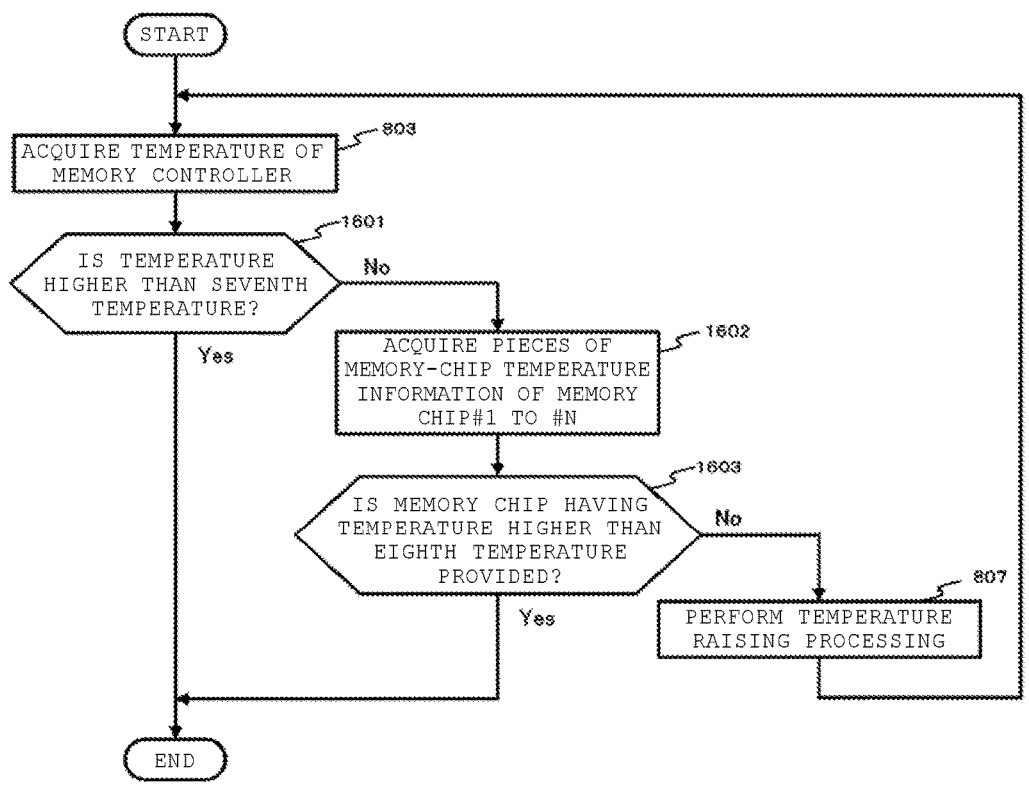
FIG. 16 is a flowchart illustrating processing of a memory controller carried out in a memory system according to a fifth embodiment.

FIG. 16 is a flowchart illustrating processing of a memory controller 200 in a memory system 1 according to a fifth embodiment. Steps in FIG. 16, which are the same as those in FIG. 8 are denoted by the same reference signs. In the present embodiment, descriptions for a configuration and an operation similar to those in the first embodiment will be omitted. A structure, a configuration, and the like of the memory system 1 in the present embodiment are similar to those in FIGS. 1 to 7.

The memory system according to the fifth embodiment is different from the memory system according to the first embodiment in that the control unit 220 of the memory controller 200 does not have a relationship with reception of a request in which an access to the nonvolatile memory 100 is required, from the host device 2, and the control unit 220 acquires the temperature of the memory controller 200 or the temperature of the memory chip 110, and performs the temperature raising processing.

The flowchart illustrated in FIG. 16 illustrates processing in which the control unit 220 of the memory controller 200 acquires the temperature of the memory controller 200 or memory-chip temperature information of the memory chip 110 at a predetermined timing, and performs the temperature raising processing in accordance with the acquired temperature. Here, the predetermined timing means, for example, upon determination that the memory system 1 does not receive a request from the host device 2, or upon determination that the memory controller 200 does not perform garbage collection, refreshment, wear leveling, patrol read, and the like.

The control unit 220 of the memory controller 200 acquires the temperature of the memory controller 200 through the temperature sensor I/F 260 at a predetermined timing (Step 803), and determines whether or not the acquired temperature of the memory controller 200 is higher than the predetermined seventh temperature (Step 1601). The predetermined seventh temperature may be equal to the predetermined first temperature, the predetermined third temperature, or the predetermined fifth temperature in the processing of the memory controller 200 in the first embodiment, or may be different.

When the temperature of the memory controller 200 is not higher than the predetermined seventh temperature (No in Step 1601), the control unit 220 of the memory controller 200 instructs the memory I/F 250 to read memory-chip temperature information of each of the memory chip 110-1, . . . , and the memory chip 110-N. The control unit 220 acquires each memory-chip temperature information via the memory I/F 250 (Step 1602).

The control unit 220 of the memory controller 200 determines whether or not a memory chip 110 having a temperature higher than a predetermined eighth temperature is provided among the memory chip 110-1, . . . , and the memory chip 110-N(Step 1603). The predetermined eighth temperature may be equal to the predetermined second temperature, the predetermined fourth temperature, or the predetermined sixth temperature in the processing of the memory controller 200 in the first embodiment, or may be different. The predetermined eighth temperature may be equal to the predetermined seventh temperature, or may be different from the predetermined seventh temperature.

When a memory chip 110 having a temperature higher than the predetermined eighth temperature is not provided among the memory chip 110-1, . . . , and the memory chip 110-N(No in Step 1603), the control unit 220 of the memory controller 200 performs the temperature raising processing (Step 807).

The process returns to Step 803 after the control unit 220 of the memory controller 200 performs the temperature raising processing (Step 807). The control unit 220 acquires the temperature of the memory controller 200 again via the temperature sensor I/F 260 (Step 803).

When the temperature of the memory controller 200 is higher than the predetermined seventh temperature (Yes in Step 1601) or when a memory chip 110 having a temperature higher than the predetermined eighth temperature is provided among the memory chip 110-1, . . . , and the memory chip 110-N(Yes in Step 1603), the flowchart illustrated in FIG. 16 is ended.

In FIG. 16, as long as the temperature of the memory controller 200 is not higher than the predetermined seventh temperature, and a memory chip 110 having a temperature higher than the predetermined eighth temperature is not provided among the memory chip 110-1, . . . , and the memory chip 110-N, the control unit 220 of the memory controller 200 continuously perform the temperature raising processing. However, the control unit 220 of the memory controller 200 may suspend the temperature raising processing if the control unit 220 detects a timeout.

For example, when the memory system 1 receives a request from the host device 2 or when the memory controller 200 performs garbage collection, refreshment, wear leveling, patrol read, and the like, the control unit 220 of the memory controller 200 may detect a timeout. If a certain period elapses from a certain timing, the memory controller 200 may detect a timeout.

In FIG. 16, when a memory chip 110 having a temperature higher than the predetermined eighth temperature is provided among the memory chip 110-1, . . . , and the memory chip 110-N, the control unit 220 of the memory controller 200 may not perform the temperature raising processing. However, a condition in which the temperature raising processing is not performed may be appropriately changed.

For example, when the number of memory chips 110 having a temperature higher than the predetermined eighth temperature among the memory chip 110-1, . . . , and the memory chip 110-N is equal to or more than a predetermined number, the control unit 220 of the memory controller 200 may not perform the temperature raising processing.

For example, when the number of memory chips 110 having a temperature higher than the predetermined eighth temperature among the memory chip 110-1, . . . , and the memory chip 110-N is equal to or more than a predetermined first number, and the number of memory chips 110 having a temperature higher than a predetermined ninth temperature among the memory chip 110-1, . . . , and the memory chip 110-N is equal to or more than a predetermined second number, the control unit 220 of the memory controller 200 may not perform the temperature raising processing. Here, the predetermined ninth temperature may be different from the predetermined eighth temperature. The second number may be equal to the first number, or may be different from the first number.

According to the fifth embodiment, in the memory system 1, similarly to the first embodiment, even when the nonvolatile memory 100 is weak in an operation at a low temperature, it is possible to improve reliability of data held in the nonvolatile memory 100.

According to the fifth embodiment, when the memory controller 200 does not receive a request from the host device 2 or when the memory controller 200 does not perform garbage collection, refreshment, wear leveling, patrol read, and the like, the memory controller 200 performs processing for raising the temperature of the memory controller 200 and the temperature of the memory chip 110. When the memory controller 200 receives a request from the host device 2, the memory controller 200 does not perform processing for raising the temperature of the memory controller 200 and the temperature of the memory chip 110. Thus, latency for a request of the host device 2 is reduced when the request is received from the host device 2.

Sixth Embodiment

Figure 17:
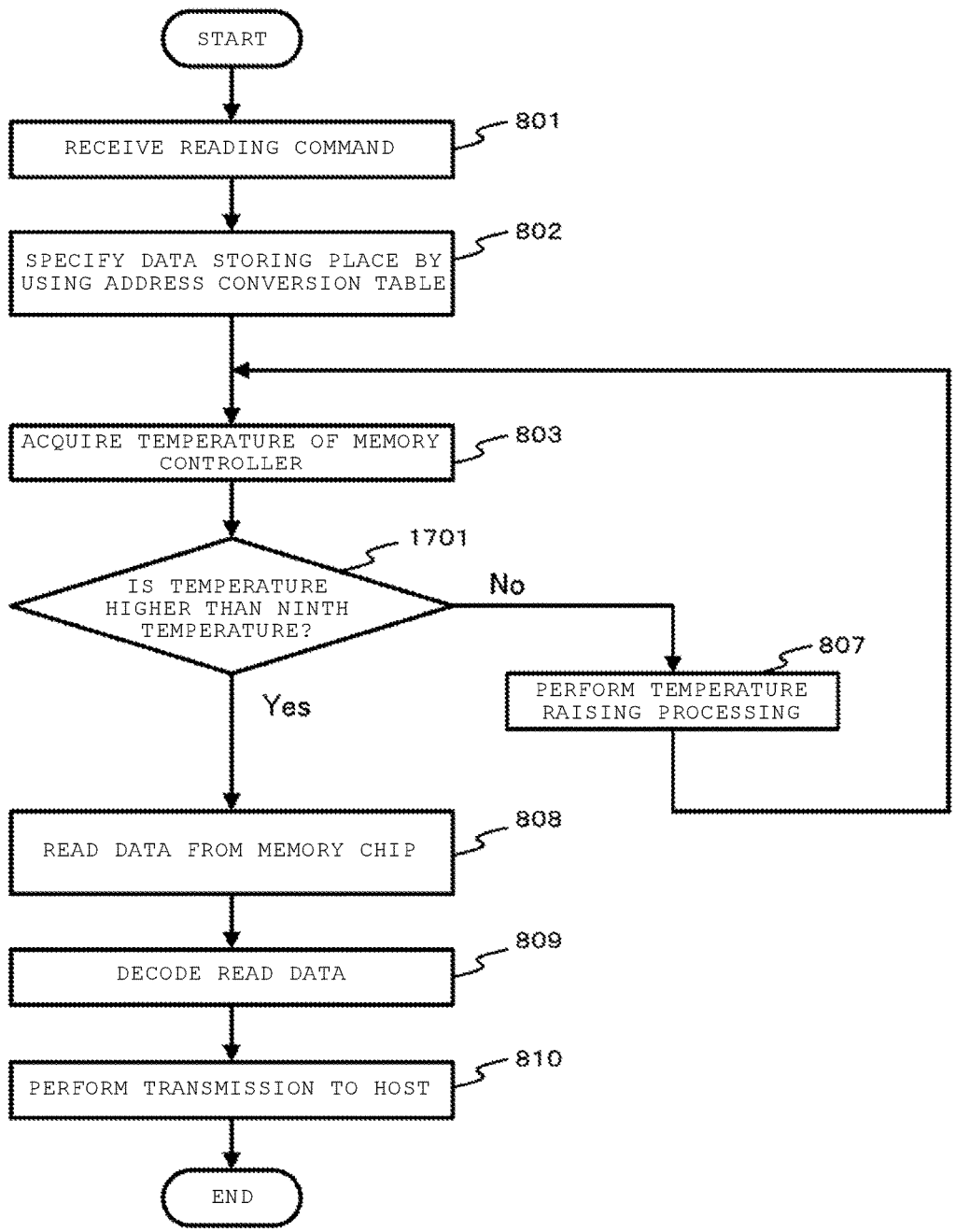
FIG. 17 is a flowchart of a process of reading data from a nonvolatile memory in response to a reading request from a host device in a memory system according to a sixth embodiment.

FIG. 17 is a flowchart of reading processing of data from the nonvolatile memory 100 in response to a reading request from the host device 2 in a memory system according to a sixth embodiment. Parts in FIG. 17, which are the same as those in the configuration in FIG. 8 are denoted by the same reference signs. In the descriptions of the present embodiment, repetitive descriptions for a configuration and an operation similar to those in the first embodiment will be omitted. An appearance, a configuration, and the like of the memory system 1 in the present embodiment are similar to those in FIGS. 1 to 7.

In the present embodiment, similar to the first embodiment, descriptions will be made on the assumption that a memory chip 110 which is an access destination corresponding to the logical address which is designated in the reading request from the host device 2 is the memory chip 110-1.

The memory system according to the embodiment is different from the memory system according to the first embodiment. The control unit 220 of the memory controller 200 performs processing (Step 802) of determining a memory chip 110 and a physical address to which access may be performed in order to process the reading request from the host device 2. Then, the control unit 220 does not acquire the temperature of the memory chip 110 and performs the reading processing of data from the memory chip 110 or the temperature raising processing based on the temperature of the memory controller 200.

If the control unit 220 of the memory controller 200 converts a logical address which is an address designated in the reading request, into a physical address, and the control unit 220 determines a memory chip 110 and a physical address to which access may be performed in order to process the reading request from the host device 2 (Step 802), the control unit 220 acquires the temperature of the memory controller 200 via the temperature sensor I/F 260 (Step 803).

Then, the control unit 220 of the memory controller 200 determines whether or not the temperature of the memory controller 200 is higher than a predetermined ninth temperature (Step 1701). The predetermined ninth temperature may be equal to the predetermined first temperature or may be different from the first temperature.

When the temperature of the memory controller 200 is not higher than the predetermined ninth temperature (No in Step 804), the control unit 220 of the memory controller 200 performs the temperature raising processing (Step 807).

The process by the control unit 220 of the memory controller 200 returns to Step 803 after the temperature raising processing is performed (Step 807). The control unit 220 acquires the temperature of the memory controller 200 again via the temperature sensor I/F 260 (Step 803).

When the temperature of the memory controller 200 is higher than the predetermined ninth temperature (Yes in Step 1701), the memory controller 200 reads data from the memory chip 110-1 (Step 808), and then performs processing which is similar to that in the memory system according to the first embodiment.

Figure 18:
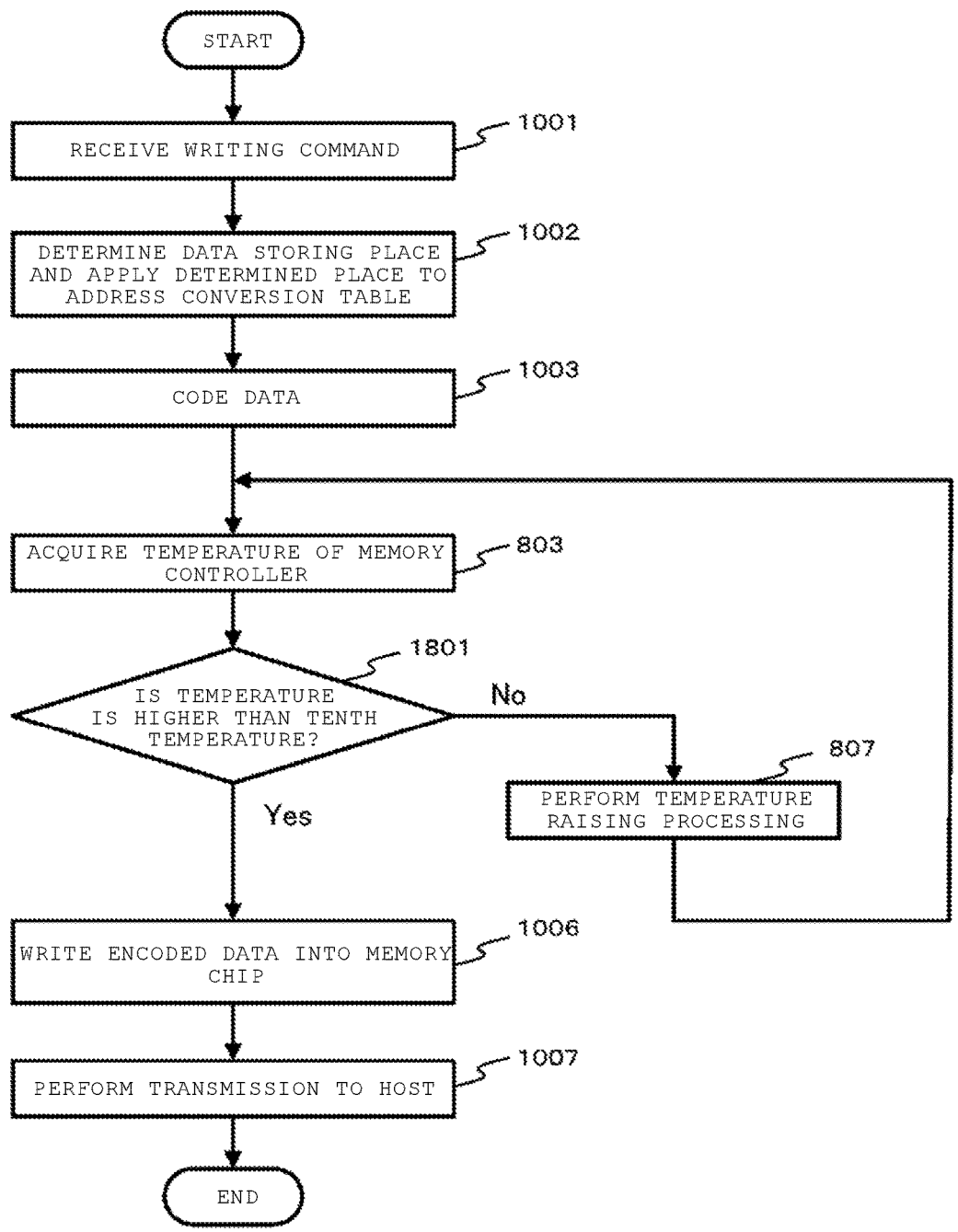
FIG. 18 is a flowchart of a process of writing data into the nonvolatile memory in response to a writing request from the host device in the memory system according to the sixth embodiment.

FIG. 18 is a flowchart of writing processing of data into the nonvolatile memory 100 in response to a writing request from the host device 2 in the memory system according to the sixth embodiment. This flowchart illustrates processing in which a data writing request is received from the host device 2, data designated in the writing request is written into the nonvolatile memory 100, and a writing result is transmitted to the host device 2. Parts in FIG. 18, which are the same as those in the configuration in FIG. 10 are denoted by the same reference signs.

The memory system according to the present embodiment is different from the memory system according to the first embodiment. The control unit 220 of the memory controller 200 codes user data which is a writing target designated in the writing request (Step 802). Then, the control unit 220 does not acquire the temperature of the memory chip 110 and performs the writing processing of data into the memory chip 110 or the temperature raising processing based on the temperature of the memory controller 200.

The control unit 220 of the memory controller 200 determines a physical address corresponding to a logical address which is designated in the writing request, and applies the determined physical address to the address conversion table (Step 1002). The control unit 220 of the memory controller 200 instructs the encoding circuit 241 to code user data which is a writing target designated in the writing request. The encoding circuit 241 codes the user data which is a writing target (Step 1003).

In the present embodiment, it is assumed that a memory chip 110 corresponding to a physical address determined for a logical address designated in a writing request from the host device 2 is the memory chip 110-1.

Then, the control unit 220 of the memory controller 200 acquires the temperature of the memory controller 200 via the temperature sensor I/F 260 (Step 803).

Then, the control unit 220 of the memory controller 200 determines whether or not the temperature of the memory controller 200 is higher than a predetermined tenth temperature (Step 1801). The predetermined tenth temperature may be equal to the predetermined third temperature or may be different from the third temperature.

When the temperature of the memory controller 200 is not higher than the predetermined tenth temperature (No in Step 1801), the control unit 220 of the memory controller 200 performs the temperature raising processing (Step 807).

The process by the control unit 220 of the memory controller 200 returns to Step 803 after the temperature raising processing is performed (Step 807). The control unit 220 acquires the temperature of the memory controller 200 again via the temperature sensor I/F 260 (Step 803).

When the temperature of the memory controller 200 is higher than the predetermined tenth temperature (Yes in Step 1801), the control unit 220 of the memory controller 200 writes encoded data into the memory chip 110-1 via the memory I/F 250 (Step 1006), and performs processing similar to that in the memory system according to the first embodiment.

Figure 19:
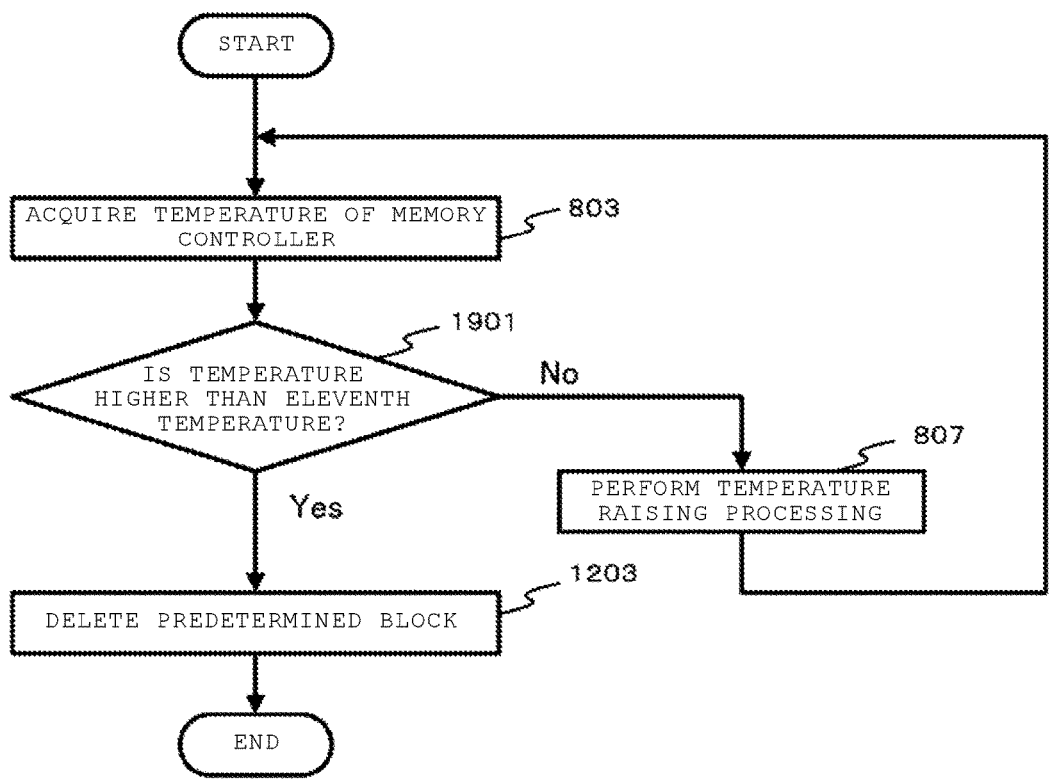
FIG. 19 is a flowchart of a process of deleting a predetermined block in the nonvolatile memory of the memory system according to the sixth embodiment.

FIG. 19 is a flowchart illustrating the processing of deleting a predetermined block in the nonvolatile memory 100 of a memory system according to the sixth embodiment. In the flowchart in FIG. 19, descriptions will be made from a stage in which the memory controller 200 determines to delete a predetermined block of the nonvolatile memory 100. Parts in FIG. 19, which are the same as those in the configuration in FIG. 12 are denoted by the same reference signs.

In the present embodiment, it is assumed that a memory chip 110 including a predetermined block which is set as a deletion target is the memory chip 110-1.

The memory system according to the present embodiment is different from the memory system according to the first embodiment. The control unit 220 of the memory controller 200 does not acquire the temperature of the memory chip 110 and performs the processing of deleting a predetermined block of the memory chip 110 or the temperature raising processing based on the temperature of the memory controller 200.

The control unit 220 of the memory controller 200 acquires the temperature of the memory controller 200 via the temperature sensor I/F 260 (Step 803).

Then, the control unit 220 of the memory controller 200 determines whether or not the temperature of the memory controller 200 is higher than a predetermined eleventh temperature (Step 1901). The predetermined eleventh temperature may be equal to the predetermined fifth temperature or may be different from the fifth temperature.

When the temperature of the memory controller 200 is not higher than the predetermined eleventh temperature (No in Step 1901), the control unit 220 of the memory controller 200 performs the temperature raising processing (Step 807).

The processing by the control unit 220 of the memory controller 200 returns to Step 803 after the temperature raising processing is performed (Step 807). The control unit 220 acquires the temperature of the memory controller 200 again via the temperature sensor I/F 260 (Step 803).

When the temperature of the memory controller 200 is higher than the predetermined eleventh temperature (Yes in Step 1901), the control unit 220 of the memory controller 200 instructs the memory I/F 250 to delete a predetermined block (Step 1203).

According to the above-described sixth embodiment, in the memory system 1, similar to the first embodiment, even when the nonvolatile memory 100 is weak in an operation at a low temperature, it is possible to reduce stress in the memory cell of the nonvolatile memory 100. In addition, it is possible to improve reliability of data held in the nonvolatile memory 100 and data read from the nonvolatile memory 100. It is possible to reduce an occurrence frequency of the reading error from the nonvolatile memory 100 and the writing error in the nonvolatile memory 100.

Seventh Embodiment

Figure 20:
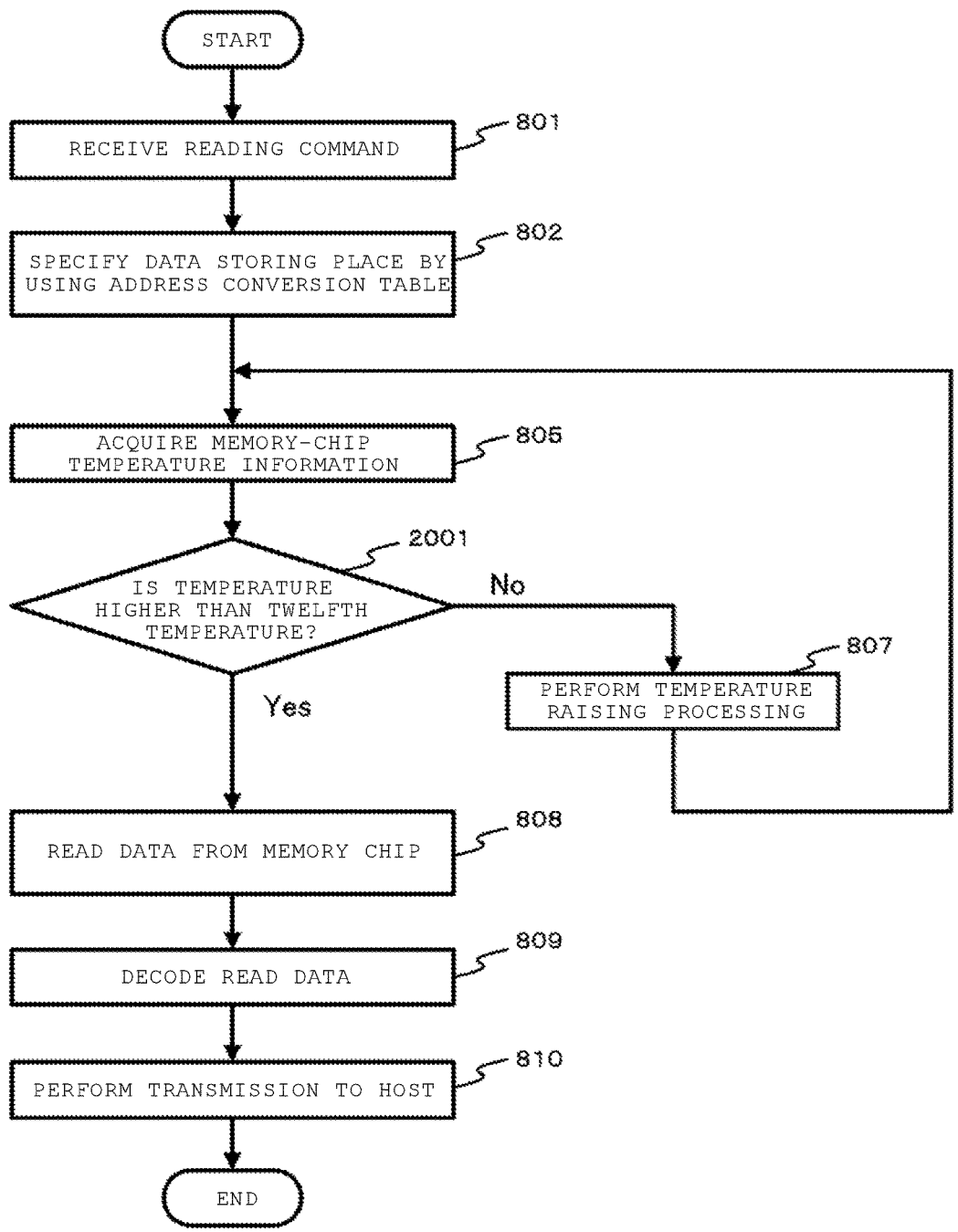
FIG. 20 is a flowchart of reading data from a nonvolatile memory in response to a reading request from a host device in a memory system according to a seventh embodiment.

FIG. 20 is a flowchart of reading processing of data from the nonvolatile memory 100 in response to a reading request from the host device 2 in a memory system according to a seventh embodiment. Parts in FIG. 20, which are the same as those in the configuration in FIG. 8 are denoted by the same reference signs. In the descriptions of the present embodiment, repetitive descriptions for a configuration and an operation similar to those in the first embodiment will be omitted. An appearance, a configuration, and the like of the memory system 1 in the present embodiment are similar to those in FIGS. 1 to 7.

The memory system according to the present embodiment is different from the memory system according to the first embodiment. The control unit 220 of the memory controller 200 performs processing (Step 802) of determining a memory chip 110 and a physical address to which access may be performed in order to process the reading request from the host device 2. Then, the control unit 220 does not acquire the temperature of the memory controller 200 and performs the reading processing of data from the memory chip 110 or the temperature raising processing based on the temperature of the memory chip 110.

The control unit 220 of the memory controller 200 converts a logical address which is an address designated in the reading request, into a physical address, and determines a memory chip 110 and a physical address to which access may be performed in order to process the reading request from the host device 2 (Step 802).

In the present embodiment, similar to the first embodiment, it is assumed that a memory chip 110 which is an access destination corresponding to the logical address which is designated in the reading request from the host device 2 is the memory chip 110-1.

The control unit 220 instructs the memory I/F 250 to read memory-chip temperature information from the memory chip 110-1 as an access destination. The control unit 220 acquires the memory-chip temperature information from the memory chip 110-1 via the memory I/F 250 (Step 805).

Then, the control unit 220 of the memory controller 200 determines whether or not the temperature of the memory chip 110-1 is higher than a predetermined twelfth temperature (Step 2001). The predetermined twelfth temperature may be equal to the predetermined second temperature or may be different from the second temperature.

When the temperature of the memory chip 110-1 is not higher than the predetermined twelfth temperature (No in Step 804), the control unit 220 of the memory controller 200 performs temperature raising processing (Step 807).

The process by the control unit 220 of the memory controller 200 returns to Step 803 after the temperature raising processing is performed (Step 807). The control unit 220 acquires the temperature of the memory chip 110-1 again via the temperature sensor I/F 260 (Step 805).

When the temperature of the memory chip 110-1 is higher than the predetermined twelfth temperature (Yes in Step 2001), the memory controller 200 reads data from the memory chip 110-1 via the memory I/F 250 (Step 808), and then performs processing which is similar to that in the memory system according to the first embodiment.

Figure 21:
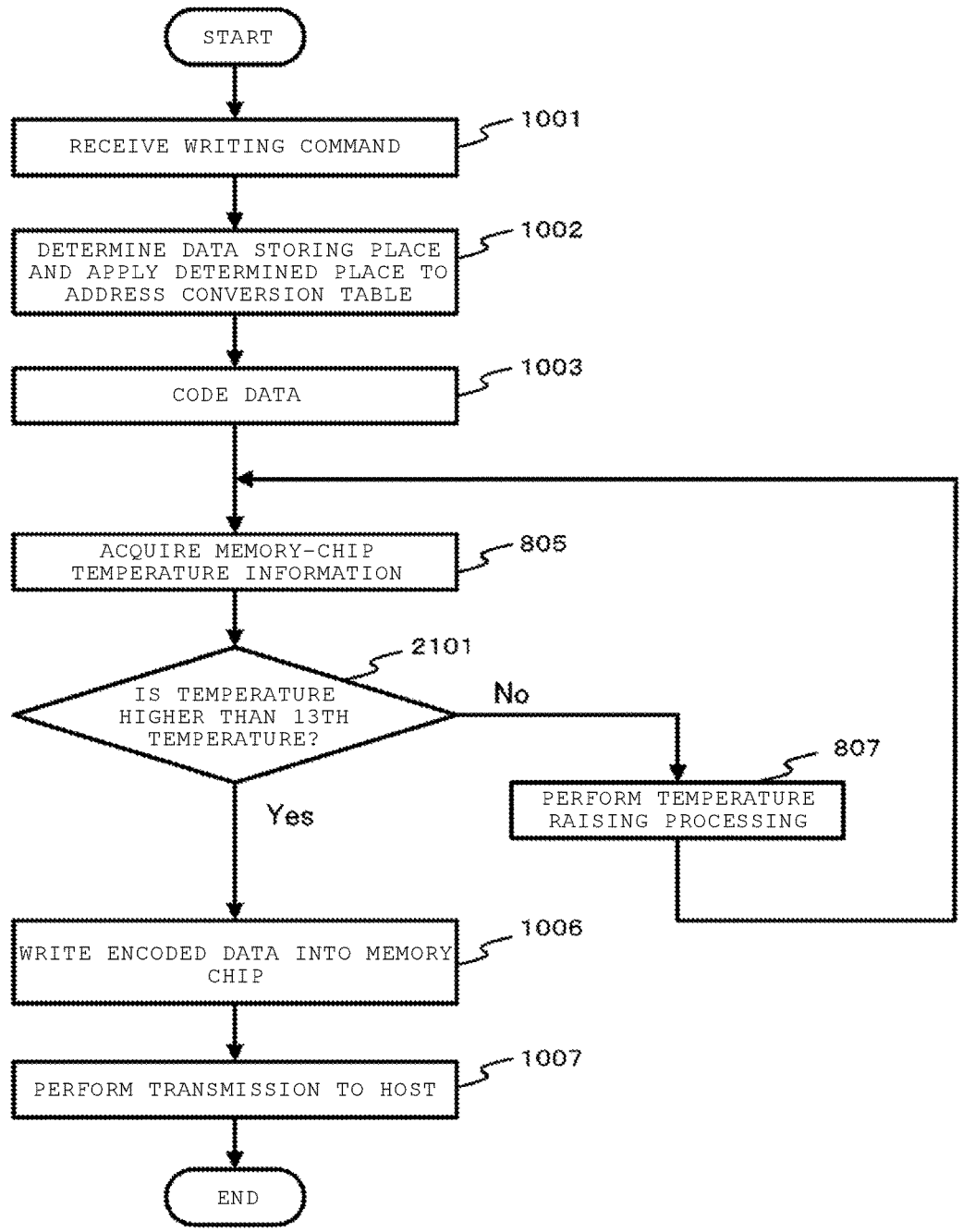
FIG. 21 is a flowchart of a process of writing data into the nonvolatile memory in response to a writing request from the host device in the memory system according to the seventh embodiment.

FIG. 21 is a flowchart of writing processing of data into the nonvolatile memory 100 in response to a writing request from the host device 2 in the memory system according to the seventh embodiment. This flowchart illustrates processing in which a data writing request is received from the host device 2, data designated in the writing request is written into the nonvolatile memory 100, and a writing result is transmitted to the host device 2. Parts in FIG. 21, which are the same as those in the configuration in FIG. 10 are denoted by the same reference signs.

The memory system according to the present embodiment is different from the memory system according to the first embodiment. The control unit 220 of the memory controller 200 codes user data which is a writing target designated in the writing request (Step 802). Then, the control unit 220 does not acquire the temperature of the memory controller 200 and performs the writing processing of data into the memory chip 110 or the temperature raising processing based on the temperature of the memory chip 110.

If the writing request is received from the host device 2 (Step 1001), the control unit 220 of the memory controller 200 determines a physical address corresponding to a logical address which is designated in the writing request, and applies the determined physical address to the address conversion table (Step 1002). The control unit 220 of the memory controller 200 instructs the encoding circuit 241 to code user data which is a writing target designated in the writing request. The encoding circuit 241 codes the user data which is a writing target (Step 1003).

In the present embodiment, it is assumed that a memory chip 110 corresponding to a physical address determined for a logical address designated in a writing request from the host device 2 is the memory chip 110-1.

Then, the control unit 220 of the memory controller 200 instructs the memory I/F 250 to read memory-chip temperature information from the memory chip 110-1 as an access destination. The control unit 220 acquires the memory-chip temperature information from the memory chip 110-1 via the memory I/F 250 (Step 805).

Then, the control unit 220 of the memory controller 200 determines whether or not the temperature of the memory chip 110-1 is higher than a predetermined thirteenth temperature (Step 1801). The predetermined thirteenth temperature may be equal to the predetermined fourth temperature or may be different from the fourth temperature.

When the temperature of the memory chip 110-1 is not higher than the predetermined thirteenth temperature (No in Step 1801), the control unit 220 of the memory controller 200 performs temperature raising processing (Step 807).

The process by the control unit 220 of the memory controller 200 returns to Step 805 after the temperature raising processing is performed (Step 807). The control unit 220 acquires the temperature of the memory chip 110-1 again via the memory I/F 250 (Step 805).

When the temperature of the memory chip 110-1 is higher than the predetermined thirteenth temperature (Yes in Step 2101), the memory controller 200 writes encoded data into the memory chip 110-1 (Step 1006), and then performs processing which is similar to that in the memory system according to the first embodiment.

Figure 22:
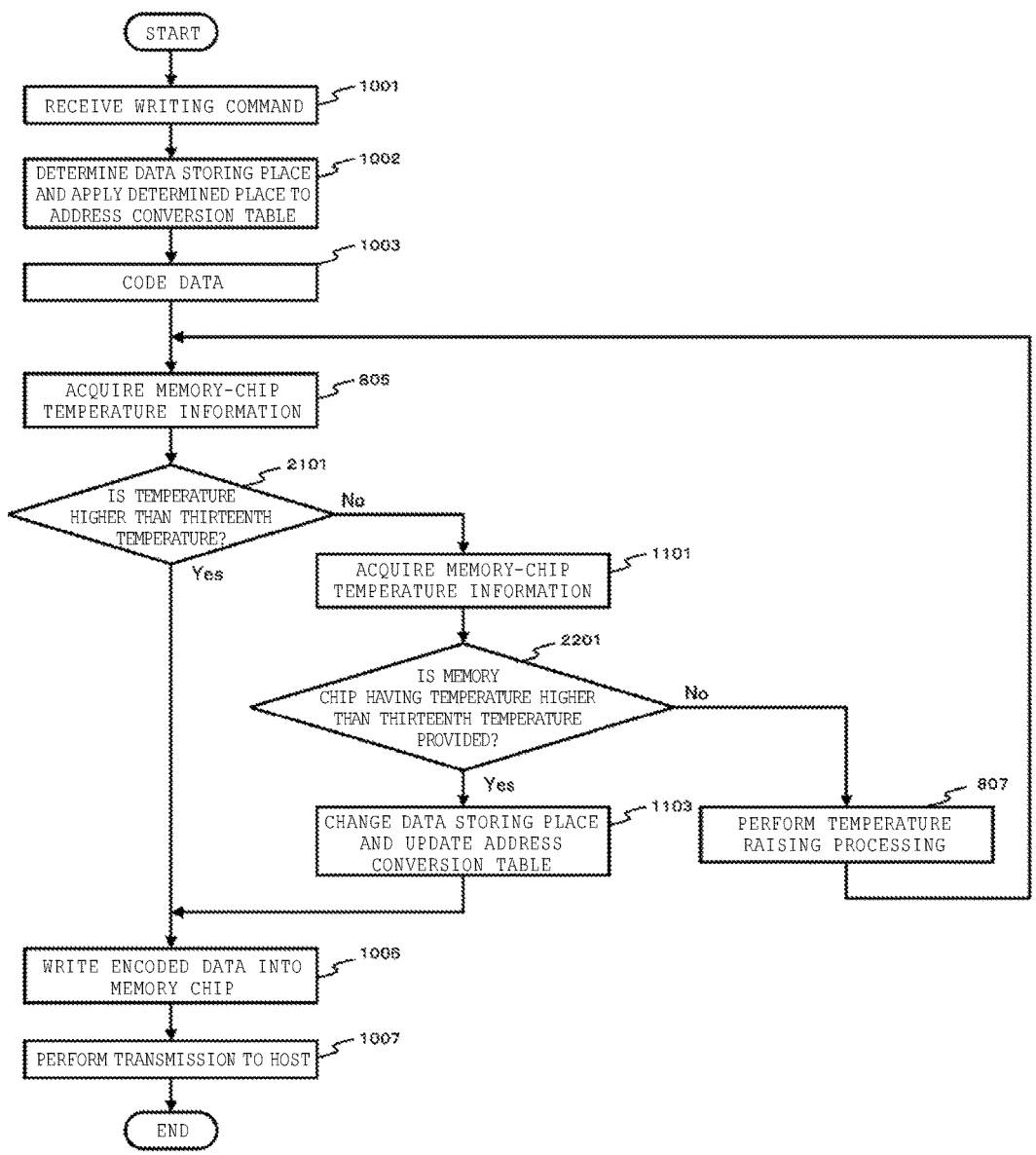
FIG. 22 is a flowchart of a modification example of the process of writing data into the nonvolatile memory in response to a writing request from the host device in the memory system according to the seventh embodiment.

FIG. 22 is a flowchart of a modification example of the writing processing of data into the nonvolatile memory 100 in response to a writing request from the host device 2 in the memory system according to the seventh embodiment. This flowchart illustrates processing in which a data writing request is received from the host device 2, user data designated in the writing request is written into the nonvolatile memory 100, and a writing result is transmitted to the host device 2. Parts in FIG. 22, which are the same as those in the configuration in FIGS. 10, 11, and 21 are denoted by the same reference signs.

In the memory system according to the modification example, when the temperature of the memory chip 110-1 is not higher than the predetermined thirteenth temperature (No in Step 2101), the control unit 220 of the memory controller 200 does not perform the temperature raising processing, but acquires temperatures of the memory chip 110-2, . . . , and the memory chip 110-N which are memory chips 110 other than the memory chip 110-1 (Step 1101).

The control unit 220 of the memory controller 200 determines whether a memory chip which has a temperature higher than the predetermined thirteenth temperature is provided among the memory chip 110-2, . . . , and the memory chip 110-N(Step 2201).

When the memory chip having a temperature higher than the predetermined thirteenth temperature is not provided (No in Step 2201), the control unit 220 of the memory controller 200 performs the temperature raising processing (Step 807). Then, the process by the control unit 220 returns to Step 805, and acquires the temperature of the memory chip 110-1 again via the memory I/F 250 (Step 805).

When the memory chip having a temperature higher than the predetermined thirteenth temperature is provided (Yes in Step 2201), the control unit 220 of the memory controller 200 changes a physical address corresponding to a logical address which is designated in the writing request, and applies the changed physical address to the address conversion table (Step 1103).

In the present modification example, it is assumed that a memory chip 110 corresponding to the changed physical address is the memory chip 110-2, that is, a memory chip 110 having a temperature higher than the predetermined thirteenth temperature among the memory chip 110-2, . . . , and the memory chip 110-N is the memory chip 110-2.

When the control unit 220 of the memory controller 200 applies the changed physical address to the address conversion table (Step 1103), the control unit 220 of the memory controller 200 changes the address conversion table so as to cause the changed physical address to be a physical address corresponding to the memory chip 110-2.

After the control unit 220 of the memory controller 200 applies the changed physical address to the address conversion table (Step 1103), the control unit 220 of the memory controller 200 instructs the memory I/F 250 to write encoded data into the memory chip 110-2, and writes data into the memory chip 110-2 via the memory I/F 250 (Step 1006).

Then, the memory controller 200 transmits a result of writing data into the memory chip 110-2, to the host device 2 via the host I/F 210 (Step 1007).

When the temperature of the memory chip 110-1 is higher than the predetermined thirteenth temperature (Yes in Step 2101), the memory controller 200 writes encoded data into the memory chip 110-1 via the memory I/F 250 (Step 1006), and performs processing similar to that in the memory system according to the first embodiment.

In the present modification example, a physical address corresponding to a logical address which is designated in a writing request from the host device 2 is determined before the memory-chip temperature information is acquired (Step 1002). However, a physical address corresponding to a logical address which is designated in a writing request may not be determined before the memory-chip temperature information is acquired, but memory-chip temperature information may be acquired, and a physical address corresponding to a logical address which is designated in a writing request may be determined based on the acquired memory-chip temperature information.

That is, in the present modification example, part of memory-chip temperature information of the memory chip 110-1, . . . , and the memory chip 110-N may be acquired. When the temperature of the memory chip 110-1 is not higher than the predetermined thirteenth temperature, but the temperature of the memory chip 110-2 is higher than the predetermined thirteenth temperature, the memory chip 110-2 may be determined as a memory chip 110 of a data writing destination, and a physical address corresponding to the memory chip 110-2 may be applied to the address conversion table.

Figure 23:
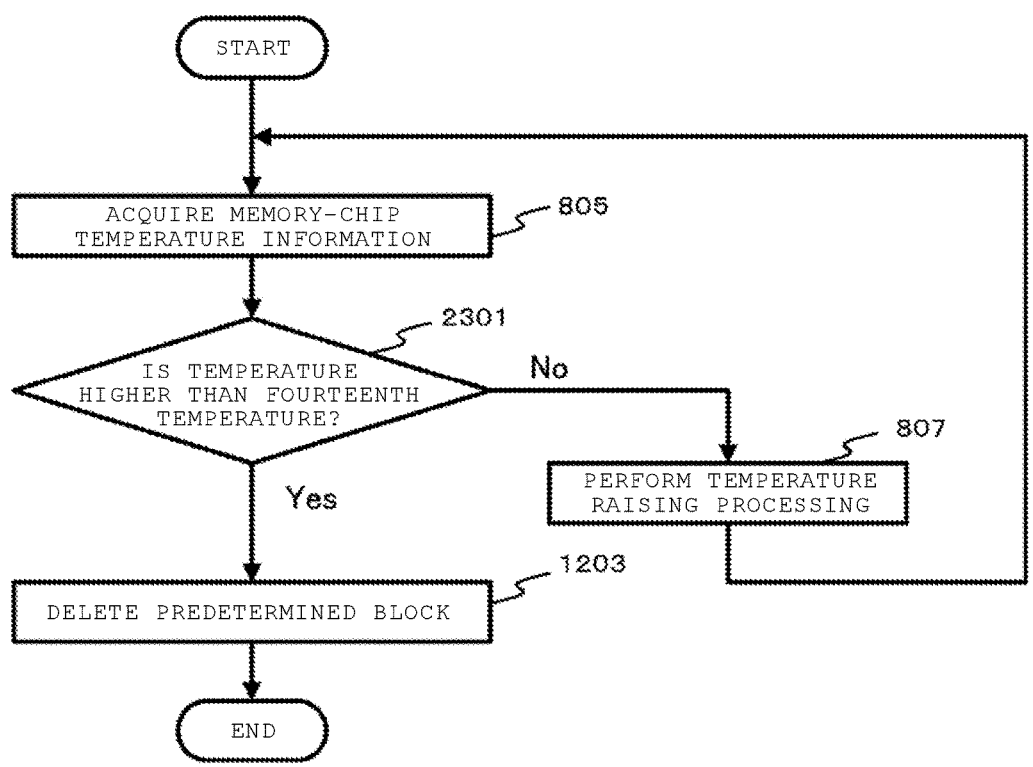
FIG. 23 is a flowchart of a process of deleting a predetermined block in the nonvolatile memory of the memory system according to the seventh embodiment.

FIG. 23 is a flowchart illustrating the processing of deleting a predetermined block in the nonvolatile memory 100 of a memory system according to the seventh embodiment. In the flowchart in FIG. 23, descriptions will be made from a stage in which the memory controller 200 determines to delete a predetermined block of the nonvolatile memory 100. Parts in FIG. 23, which are the same as those in the configuration in FIG. 12 are denoted by the same reference signs.

In the present embodiment, it is assumed that a memory chip 110 including a predetermined block which is set as a deletion target is the memory chip 110-1.

The memory system according to the present embodiment is different from the memory system according to the first embodiment. The memory controller 200 does not acquire the temperature of the memory controller 200 and performs the processing of deleting a predetermined block of the memory chip 110 or the temperature raising processing based on the temperature of the memory chip 110.

The control unit 220 of the memory controller 200 acquires the temperature of the memory chip 110-1 via the memory I/F 250 (Step 805).

Then, the control unit 220 of the memory controller 200 determines whether or not the temperature of the memory controller 200 is higher than a predetermined fourteenth temperature (Step 2301). The predetermined fourteenth temperature may be equal to the predetermined sixth temperature or may be different from the sixth temperature.

When the temperature of the memory chip 110-1 is not higher than the predetermined fourteenth temperature (No in Step 2301), the control unit 220 of the memory controller 200 performs temperature raising processing (Step 807).

The process by the control unit 220 of the memory controller 200 returns to Step 805 after the temperature raising processing is performed (Step 807). The control unit 220 acquires the temperature of the memory chip 110-1 again via the memory I/F 250 (Step 805).

When the temperature of the memory controller 200 is higher than the predetermined fourteenth temperature (Yes in Step 2301), the control unit 220 of the memory controller 200 instructs the memory I/F 250 to delete a predetermined block (Step 1203).

According to the above-described seventh embodiment, in the memory system 1, similar to the first embodiment, even when the nonvolatile memory 100 is vulnerable in an operation at a low temperature, it is possible to reduce stress in the memory cell of the nonvolatile memory 100. In addition, it is possible to improve reliability of data held in the nonvolatile memory 100 and data read from the nonvolatile memory 100. It is possible to reduce an occurrence frequency of the reading error from the nonvolatile memory 100 and the writing error in the nonvolatile memory 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, comprising:
    a memory chip including a nonvolatile semiconductor memory cell array;
    a memory controller including an error correcting code (ECC) circuit;
    a first temperature sensor positioned to measure a first temperature, which is representative of a temperature of the memory controller; and
    a second temperature sensor positioned to measure a second temperature, which is representative of a temperature of the memory chip, wherein
    the memory controller is configured to, prior to performing a read access to the memory chip:
        compare the first temperature against a first threshold temperature and a second temperature against a second threshold temperature,
        carry out the read access to the memory chip when either the first temperature is greater than the first threshold temperature or the second temperature is greater than the second threshold temperature, and
        block the read access to the memory chip and operate the ECC circuit using dummy data, when neither the first temperature is greater than the first threshold temperature nor the second temperature is greater than the second threshold temperature.

2. The memory system according to claim 1, wherein the ECC circuit includes an encoding circuit, and the memory controller causes the encoding circuit to encode the dummy data.

3. The memory system according to claim 1, wherein the ECC circuit includes a decoding circuit, and the memory controller causes the decoding circuit to decode the dummy data.

4. The memory system according to claim 1, wherein the read access is included in an operation of copying data from a block of the nonvolatile semiconductor memory cell array to another block of the semiconductor memory cell array.

5. The memory system according to claim 1, wherein the memory controller is configured to carry out an initial read access of the memory chip without regard to the first and second temperatures in response to a read command received from the host, and then compares the first temperature against the first threshold temperature and the second temperature against the second threshold temperature when the initial read access fails.

6. A memory system connectable to a host, comprising:
    a plurality of memory chips, each of which includes a nonvolatile semiconductor memory cell array;
    a memory controller;
    a first temperature sensor positioned to measure a first temperature, which is representative of a temperature of the memory controller; and
    a plurality of second temperature sensors, each of which is positioned to measure a second temperature representative of a temperature of one of the memory chips, wherein
    the memory controller is configured to, prior to performing a read access to the memory chips, compare the first temperature against a first threshold temperature and a second temperature against a second threshold temperature, and perform a heating operation while preventing the read access to the memory chips when neither the first temperature is greater than the first threshold temperature nor at least one of the second temperatures is greater than the second threshold temperature.

7. The memory system according to claim 6, wherein
the memory controller includes an error correcting code (ECC) circuit, and operates the ECC circuit to perform the heating operation.

8. The memory system according to claim 6, wherein
the memory controller is configured to select one of the memory chips having a temperature higher than the second threshold temperature, as a target memory chip to be accessed.

9. The memory system according to claim 6, wherein
the memory controller is configured to determine a target memory chip to be accessed based on a write command received from the host, and change the target memory chip if the temperature corresponding to the target memory chip is lower than the second threshold temperature and if one of the other memory chips has a temperature that is higher than the second threshold temperature.

10. A method for operating a memory system including a memory chip having a nonvolatile semiconductor memory cell array, and a memory controller, the method comprising:
detecting a first temperature of the memory controller;
detecting a second temperature of the memory chip;
comparing the first temperature of the memory controller against a first threshold temperature;
comparing the second temperature of the memory chip against a second threshold temperature;
accessing the memory chip to carry out an operation in response to a read command from a host, when either the first temperature is greater than the first threshold temperature or the second temperature is greater than the second threshold temperature; and
performing a heating operation in response to the read command from the host while preventing a read access to the memory chip, when neither the first temperature is greater than the first threshold temperature nor the second temperature is greater than the second threshold temperature.

11. The method according to claim 10, wherein
the memory controller includes an error correcting code (ECC) circuit, and
the heating operation includes operating the ECC circuit.

12. The method according to claim 10, further comprising:
accessing the memory chip without regard to the first and second temperatures in response to an earlier command received from the host prior to the read command; and
only after detecting that access to the memory chip in response to the earlier command failed, performing the conditional read access to the memory chip based on the detected first and second temperatures, and the first and second threshold temperatures.

13. The memory system according to claim 3, wherein
after the decoding circuit has decoded the dummy data, the memory controller reads data from the memory chip and control the decoding circuit to decode the read data when either the first temperature is greater than the first threshold temperature or the second temperature is greater than the second threshold temperature.

14. The memory system according to claim 13, wherein
the read of the data is triggered by a read command from the host that designates a logical address of the data, and
the memory controller determines a physical address in the memory chip, mapped to the logical address.

* * * * *